US012563893B2

(12) United States Patent
Chang et al.

(10) Patent No.: US 12,563,893 B2
(45) Date of Patent: Feb. 24, 2026

(54) METHOD FOR FORMING AN ISOLATION STRUCTURE HAVING MULTIPLE THICKNESSES TO MITIGATE DAMAGE TO A DISPLAY DEVICE

(71) Applicant: Taiwan Semiconductor Manufacturing Company, Ltd., Hsin-Chu (TW)

(72) Inventors: Yung-Chang Chang, Taipei City (TW); Ming Chyi Liu, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 74 days.

(21) Appl. No.: 17/872,585

(22) Filed: Jul. 25, 2022

(65) Prior Publication Data

US 2022/0359846 A1 Nov. 10, 2022

Related U.S. Application Data

(62) Division of application No. 16/884,375, filed on May 27, 2020, now Pat. No. 11,980,046.

(51) Int. Cl.
H10K 59/12 (2023.01)
H10K 59/122 (2023.01)
(Continued)

(52) U.S. Cl.
CPC ....... H10K 59/1201 (2023.02); H10K 59/122 (2023.02); H10K 59/124 (2023.02); (Continued)

(58) Field of Classification Search
CPC ............. H10K 59/122; H10K 59/1201; H10K 59/123; H10K 59/131; H10K 59/124; (Continued)

(56) References Cited

U.S. PATENT DOCUMENTS 4,538,143 A 8/1985 Ito
5,213,984 A 5/1993 Okada et al.
(Continued)

FOREIGN PATENT DOCUMENTS

GB 2570580 A 7/2019
KR 20090003590 A 1/2009

OTHER PUBLICATIONS

Waechtler et al. "Optical Properties of Sputtered Tantalum Nitride Films Determined by Spectroscopic Ellipsometry." Oral contributed presentation; 4th Workshop Ellipsometry, Feb. 20-22, 2006, Berlin, Germany, published Mar. 16, 2006.
(Continued)

*Primary Examiner* — Sophia T Nguyen
(74) *Attorney, Agent, or Firm* — Eschweiler & Potashnik, LLC

(57) ABSTRACT

In some embodiments, the present disclosure relates to a method of forming a display device, comprising: forming a first reflector electrode and a second reflector electrode over an interconnect structure, wherein the first reflector electrode is laterally separated from the second reflector electrode; depositing a first isolation layer over the first and second reflector electrodes; forming a first masking layer directly overlying the first reflector electrode; depositing a second isolation layer over the first isolation layer and over the first masking layer; forming a second masking layer over the second isolation layer and directly overlying the second reflector electrode; performing a first removal process to remove portions of the first and second isolation layers that do not directly underlie the first or second masking layers; and performing a second removal process to remove the first and second masking layers.

20 Claims, 11 Drawing Sheets

(51) Int. Cl.
  *H10K 59/124* (2023.01)
  *H10K 59/80* (2023.01)
(52) U.S. Cl.
  CPC . *H10K 59/80518* (2023.02); *H10K 59/80524*
    (2023.02); *H10K 59/12* (2023.02); *H10K 59/876* (2023.02)
(58) Field of Classification Search
  CPC ............. H10K 50/852; H10K 50/8445; H10K
    50/844; H10K 50/818; H10K 50/856;
    H10K 50/81; H10K 50/805; H10K 50/82;
    H10K 50/824; H10K 50/814; H10K
    71/00; H10K 71/621; H10K 71/60
  See application file for complete search history.

(56) References Cited

U.S. PATENT DOCUMENTS

| | | | | |
|---|---|---|---|---|
| 6,414,738 | B1 | 7/2002 | Fujikawa | |
| 7,615,792 | B2* | 11/2009 | Yokoyama | H10K 50/824 257/E33.064 |
| 7,812,519 | B2 | 10/2010 | Chang et al. | |
| 7,868,543 | B2 | 1/2011 | Kobayashi | |
| 7,969,087 | B2* | 6/2011 | Hwang | H10K 59/351 313/506 |
| 8,193,700 | B2* | 6/2012 | You | H10K 59/876 313/506 |
| 8,237,360 | B2 | 8/2012 | Kinoshita | |
| 8,816,579 | B2* | 8/2014 | Kim | H10K 59/122 313/504 |
| 8,847,215 | B2 | 9/2014 | Park et al. | |
| 8,933,471 | B2* | 1/2015 | Kurata | H10K 59/35 257/89 |
| 9,337,448 | B2* | 5/2016 | Lee | H10K 59/30 |
| 9,653,520 | B2 | 5/2017 | Kim et al. | |
| 9,660,219 | B2 | 5/2017 | Shin et al. | |
| 10,192,933 | B2* | 1/2019 | Hsu | H10K 59/32 |
| 10,263,046 | B2* | 4/2019 | Hashimoto | H10K 71/135 |
| 10,403,695 | B2 | 9/2019 | Bang et al. | |
| 10,431,774 | B2* | 10/2019 | Lai | H10K 50/856 |
| 10,916,589 | B2 | 2/2021 | Bang et al. | |
| 10,930,708 | B2 | 2/2021 | Quan et al. | |
| 10,943,817 | B2 | 3/2021 | Yeoh et al. | |
| 11,024,774 | B2 | 6/2021 | Chang et al. | |
| 11,069,873 | B2 | 7/2021 | Chang et al. | |
| 11,189,815 | B2 | 11/2021 | Kim et al. | |
| 11,289,669 | B2* | 3/2022 | Yang | H10K 50/13 |
| 11,404,490 | B2 | 8/2022 | Li et al. | |
| 11,744,131 | B2* | 8/2023 | Li | H10K 50/816 257/40 |
| 11,765,923 | B2* | 9/2023 | Kato | H10K 59/35 |
| 11,828,943 | B2* | 11/2023 | Joung | H10K 59/876 |
| 11,910,639 | B2* | 2/2024 | Na | H10K 59/88 |
| 12,408,509 | B2* | 9/2025 | Haas | H10K 71/621 |
| 2002/0076495 | A1* | 6/2002 | Maloney | H01L 21/02205 427/256 |
| 2002/0093284 | A1 | 7/2002 | Adachi et al. | |
| 2003/0146695 | A1 | 8/2003 | Seki | |
| 2003/0230972 | A1 | 12/2003 | Cok | |
| 2004/0217697 | A1* | 11/2004 | Lee | H10K 50/818 313/506 |
| 2005/0006768 | A1* | 1/2005 | Narasimhan | C23C 14/35 257/E21.279 |
| 2005/0008770 | A1 | 1/2005 | Kawase | |
| 2005/0067953 | A1 | 3/2005 | Yamazaki et al. | |
| 2005/0079695 | A1* | 4/2005 | Carriere | H01L 21/28097 257/E21.444 |
| 2005/0142976 | A1* | 6/2005 | Suzuki | H10K 50/852 445/24 |
| 2005/0161830 | A1 | 7/2005 | Iki | |
| 2005/0213002 | A1 | 9/2005 | Wen et al. | |
| 2005/0225232 | A1* | 10/2005 | Boroson | H10K 59/30 313/504 |

| | | | | |
|---|---|---|---|---|
| 2006/0009025 | A1* | 1/2006 | Kanamura | H01L 21/76813 438/618 |
| 2006/0108917 | A1 | 5/2006 | Chung | |
| 2006/0115231 | A1* | 6/2006 | Ishida | H10K 50/805 385/147 |
| 2006/0244369 | A1 | 11/2006 | Eiichi | |
| 2007/0102737 | A1* | 5/2007 | Kashiwabara | H10K 50/856 257/291 |
| 2007/0132368 | A1 | 6/2007 | Kuwahara et al. | |
| 2007/0164275 | A1* | 7/2007 | Ishiguro | H10K 50/856 257/40 |
| 2008/0169757 | A1 | 7/2008 | Chang et al. | |
| 2008/0258609 | A1* | 10/2008 | Nakamura | H10K 59/876 445/24 |
| 2008/0268630 | A1* | 10/2008 | Khan | H01L 21/823462 438/587 |
| 2008/0284326 | A1 | 11/2008 | Choi et al. | |
| 2009/0026921 | A1* | 1/2009 | Kuma | H10K 50/852 313/504 |
| 2009/0153036 | A1* | 6/2009 | Gonda | H10K 50/852 313/504 |
| 2009/0160322 | A1 | 6/2009 | Yoshida et al. | |
| 2009/0170230 | A1 | 7/2009 | Kidu et al. | |
| 2009/0200544 | A1* | 8/2009 | Lee | H10K 50/816 438/35 |
| 2009/0251051 | A1 | 10/2009 | Dwang et al. | |
| 2009/0256477 | A1 | 10/2009 | Chung et al. | |
| 2009/0278450 | A1 | 11/2009 | Sonoyama et al. | |
| 2009/0322215 | A1* | 12/2009 | Sung | H10K 50/805 445/24 |
| 2010/0052524 | A1* | 3/2010 | Kinoshita | H10K 50/852 313/506 |
| 2011/0241038 | A1* | 10/2011 | Kashiwabara | H10K 50/82 257/89 |
| 2011/0317429 | A1* | 12/2011 | Aiba | H10K 50/852 427/508 |
| 2012/0098412 | A1 | 4/2012 | Shin et al. | |
| 2012/0098414 | A1 | 4/2012 | Nakamura | |
| 2012/0112172 | A1 | 5/2012 | Kashiwabara | |
| 2012/0228603 | A1 | 9/2012 | Nakamura | |
| 2012/0248465 | A1 | 10/2012 | Choi et al. | |
| 2012/0286296 | A1* | 11/2012 | So | H10K 85/00 257/E51.012 |
| 2012/0299002 | A1 | 11/2012 | Kinoshita | |
| 2012/0305902 | A1* | 12/2012 | So | H10K 50/852 257/40 |
| 2013/0038203 | A1* | 2/2013 | Kim | H10K 50/816 445/24 |
| 2013/0082246 | A1* | 4/2013 | Hasegawa | H10K 50/852 257/89 |
| 2013/0119388 | A1 | 5/2013 | Lee et al. | |
| 2013/0140535 | A1* | 6/2013 | Chu | H10K 59/351 257/40 |
| 2013/0147689 | A1* | 6/2013 | Liu | H10K 59/30 345/76 |
| 2013/0187132 | A1* | 7/2013 | Ando | H10K 50/80 101/35 |
| 2013/0193419 | A1* | 8/2013 | Mizuno | H10K 50/852 257/40 |
| 2013/0270536 | A1* | 10/2013 | Setz | H10K 50/852 257/40 |
| 2013/0285023 | A1* | 10/2013 | Kurata | H10K 50/805 257/89 |
| 2014/0028181 | A1 | 1/2014 | Lee et al. | |
| 2014/0131679 | A1* | 5/2014 | Lee | H10K 50/852 257/40 |
| 2014/0183460 | A1 | 7/2014 | Kim et al. | |
| 2014/0203245 | A1* | 7/2014 | Gupta | H10K 50/805 438/23 |
| 2014/0209870 | A1* | 7/2014 | Shim | H10K 50/852 257/40 |
| 2015/0008411 | A1* | 1/2015 | Matsumoto | H10K 59/35 438/35 |
| 2015/0108446 | A1* | 4/2015 | Ando | H10K 59/353 438/34 |
| 2015/0144908 | A1 | 5/2015 | Yoon et al. | |

(56) References Cited

U.S. PATENT DOCUMENTS

| | | | |
|---|---|---|---|
| 2015/0187579 A1* | 7/2015 | Lin | H01L 21/3081 |
| | | | 438/761 |
| 2015/0214505 A1* | 7/2015 | Xiong | H10K 59/35 |
| | | | 257/40 |
| 2015/0263304 A1 | 9/2015 | Kim et al. | |
| 2015/0270510 A1 | 9/2015 | Shin et al. | |
| 2015/0280170 A1 | 10/2015 | Harikrishna Mohan et al. | |
| 2016/0126294 A1 | 5/2016 | Nozawa et al. | |
| 2016/0133878 A1 | 5/2016 | Jesaka et al. | |
| 2016/0190523 A1 | 6/2016 | Kim et al. | |
| 2016/0315131 A1 | 10/2016 | Li et al. | |
| 2016/0365390 A1 | 12/2016 | Hsu et al. | |
| 2016/0372528 A1 | 12/2016 | Kamura et al. | |
| 2017/0077448 A1 | 3/2017 | Sakamoto et al. | |
| 2017/0092707 A1 | 3/2017 | Wang | |
| 2017/0187001 A1* | 6/2017 | Fang | H10K 50/852 |
| 2017/0194385 A1 | 7/2017 | Jung et al. | |
| 2017/0207249 A1 | 7/2017 | Rhee | |
| 2017/0279084 A1 | 9/2017 | Sakamoto et al. | |
| 2017/0352842 A1* | 12/2017 | Shiratori | H10K 50/82 |
| 2018/0061896 A1* | 3/2018 | Cheng | H10K 50/818 |
| 2018/0061905 A1 | 3/2018 | Choi et al. | |
| 2018/0076270 A1* | 3/2018 | Kwon | H10K 77/111 |
| 2018/0138259 A1 | 5/2018 | Kim et al. | |
| 2018/0190740 A1 | 7/2018 | Bang et al. | |
| 2018/0190944 A1 | 7/2018 | Lee et al. | |
| 2018/0226456 A1* | 8/2018 | Hsu | H10K 59/35 |
| 2018/0233694 A1 | 8/2018 | Ajiki et al. | |
| 2018/0240854 A1 | 8/2018 | Nozawa et al. | |
| 2018/0254303 A1 | 9/2018 | Mishima | |
| 2018/0301519 A1 | 10/2018 | Ma et al. | |
| 2019/0006617 A1 | 1/2019 | Miura et al. | |
| 2019/0043930 A1* | 2/2019 | Wang | H10K 71/00 |
| 2019/0165085 A1 | 5/2019 | Choi et al. | |
| 2019/0165317 A1* | 5/2019 | Lai | H10K 50/828 |
| 2019/0172874 A1 | 6/2019 | Lim et al. | |
| 2019/0172898 A1 | 6/2019 | Choi | |
| 2019/0181199 A1 | 6/2019 | Choi et al. | |
| 2019/0181200 A1 | 6/2019 | Jung et al. | |
| 2019/0189701 A1 | 6/2019 | Bang et al. | |
| 2019/0189713 A1 | 6/2019 | Kondo | |
| 2019/0206949 A1 | 7/2019 | Park et al. | |
| 2019/0206953 A1 | 7/2019 | Hsieh et al. | |
| 2019/0256655 A1 | 8/2019 | Masuda et al. | |
| 2019/0363276 A1* | 11/2019 | Li | H10K 59/35 |
| 2019/0363290 A1 | 11/2019 | Watanabe | |
| 2020/0013839 A1 | 1/2020 | Tanaka et al. | |
| 2020/0028107 A1 | 1/2020 | Sakaguchi | |
| 2020/0035754 A1* | 1/2020 | Li | H10K 50/818 |
| 2020/0035758 A1 | 1/2020 | Kang et al. | |
| 2020/0111846 A1* | 4/2020 | Takahara | H10K 59/35 |
| 2020/0119106 A1 | 4/2020 | Kim | |
| 2020/0135704 A1* | 4/2020 | Herner | H01L 21/76898 |
| 2020/0136078 A1 | 4/2020 | Mishima et al. | |
| 2020/0136095 A1* | 4/2020 | Ju | H10K 71/00 |
| 2020/0152711 A1 | 5/2020 | Liu | |
| 2020/0185471 A1 | 6/2020 | Lee et al. | |
| 2020/0185650 A1 | 6/2020 | Lim et al. | |
| 2020/0194518 A1 | 6/2020 | Myung et al. | |
| 2020/0194522 A1 | 6/2020 | Lee et al. | |
| 2020/0194713 A1 | 6/2020 | Kim et al. | |
| 2020/0203448 A1 | 6/2020 | Kim et al. | |
| 2020/0212121 A1 | 7/2020 | Kang | |
| 2020/0259125 A1* | 8/2020 | Tseng | H10K 50/15 |
| 2020/0358019 A1 | 11/2020 | Tsai et al. | |
| 2020/0381652 A1 | 12/2020 | Zhang et al. | |
| 2021/0028243 A1* | 1/2021 | Yang | H10K 71/00 |
| 2021/0050387 A1* | 2/2021 | Kim | H10K 59/30 |
| 2021/0066416 A1 | 3/2021 | Yang et al. | |
| 2021/0066663 A1* | 3/2021 | Joung | G02B 5/201 |
| 2021/0074953 A1 | 3/2021 | Kim | |
| 2021/0091334 A1 | 3/2021 | Heo et al. | |

| | | | |
|---|---|---|---|
| 2021/0098748 A1 | 4/2021 | Liu et al. | |
| 2021/0111235 A1 | 4/2021 | Ichikawa et al. | |
| 2021/0111312 A1 | 4/2021 | Chang et al. | |
| 2021/0111366 A1 | 4/2021 | Chang et al. | |
| 2021/0116810 A1 | 4/2021 | Hashimoto et al. | |
| 2021/0134895 A1 | 5/2021 | Wang et al. | |
| 2021/0159457 A1 | 5/2021 | Cho et al. | |
| 2021/0167319 A1 | 6/2021 | Quan | |
| 2021/0167331 A1* | 6/2021 | Ou | H10K 71/166 |
| 2021/0199972 A1* | 7/2021 | Joung | H10K 77/10 |
| 2021/0202886 A1 | 7/2021 | Kim et al. | |
| 2021/0233969 A1 | 7/2021 | Sun et al. | |
| 2021/0265417 A1 | 8/2021 | Lin et al. | |
| 2021/0319754 A1* | 10/2021 | Shang | G09G 3/3258 |
| 2021/0328174 A1 | 10/2021 | Chang et al. | |
| 2021/0367003 A1 | 11/2021 | Zhou et al. | |
| 2021/0367005 A1* | 11/2021 | Zou | H10K 50/84 |
| 2021/0376282 A1 | 12/2021 | Chang et al. | |
| 2022/0037432 A1 | 2/2022 | Xu et al. | |
| 2022/0140018 A1 | 5/2022 | Liu et al. | |
| 2022/0208872 A1* | 6/2022 | Takahara | H10K 50/856 |
| 2022/0216447 A1* | 7/2022 | Liu | H10K 59/124 |
| 2022/0285454 A1* | 9/2022 | Wang | H10K 59/876 |
| 2022/0285455 A1* | 9/2022 | Wang | H10K 71/00 |
| 2022/0310700 A1* | 9/2022 | Li | H10K 50/822 |
| 2022/0359609 A1 | 11/2022 | Lin et al. | |
| 2022/0376013 A1 | 11/2022 | Li et al. | |
| 2023/0301152 A1* | 9/2023 | Liu | H10K 50/856 |
| | | | 257/40 |
| 2023/0337454 A1* | 10/2023 | Haas | H10K 71/233 |
| 2024/0155866 A1* | 5/2024 | Na | H10K 59/124 |
| 2024/0251632 A1* | 7/2024 | Tang | H10K 59/80518 |

OTHER PUBLICATIONS

Southwest Center for Microsystems Education (SCME) University of New Mexico. "The Rainbow Wafer Activity." Published in 2010.

Physics and Radio-Electronics. "Light Emitting Diode (LED)." The date of publication is unknown. Retrieved online on Aug. 2, 2019 from https://www.physics-and-radio-electronics.com/electronic-devices-and-circuits/semiconductor-diodes/lightemittingdiodeledconstructionworking.html.

Kmide et al. "Light Scattering." Graphene, 2014, published in 2014.

Microwaves 101.com "Photolithography 101." Published Dec. 2011.

Mirshafieyan et al. "Silicon colors: spectral selective perfect light absorption in single layer silicon films on aluminum surface and its thermal tunability." Optics Express 22(25):31545-31554, published on Dec. 12, 2014.

Bohlen, Brandon Scott. "PECVD grown DBR for microcavity OLED sensor." Retrospective Theses and Dissertations. 14847, published in 2007.

Phuong Le Minh. "Silicon Light Emitting Devices for Integrated Applications." University of Twente, published in 2003.

Addison Engineering, Inc. "Silicon Nitride—LPCVD Grown." The date of publication is unknown. Retrieved online on Aug. 8, 2019 from https://www.addisonengineering.com/.

Wikipedia.org. "OLED." Published on Jul. 23, 2019.

Wikipedia.org "Pixel." Published on Jul. 27, 2019.

Wikipedia.org "Sputter Cleaning." Published on Nov. 6, 2017.

Wikipedia.org "Sputtering." Published on May 4, 2019.

Wikipedia.org "Transparent Conducting Film." Published on Jul. 13, 2019.

Non-Final Office Action dated Dec. 29, 2021 for U.S. Appl. No. 16/884,375.

Final Office Action dated May 5, 2022 for U.S. Appl. No. 16/884,375.

Notice of Allowance dated Dec. 11, 2023, for U.S. Appl. No. 16/884,375.

Final Office Action dated Apr. 6, 2023 for U.S. Appl. No. 16/884,375.

Non-Final Office Action dated Nov. 30, 2022 for U.S. Appl. No. 16/884,375.

* cited by examiner

300

400

2000

2100

2200

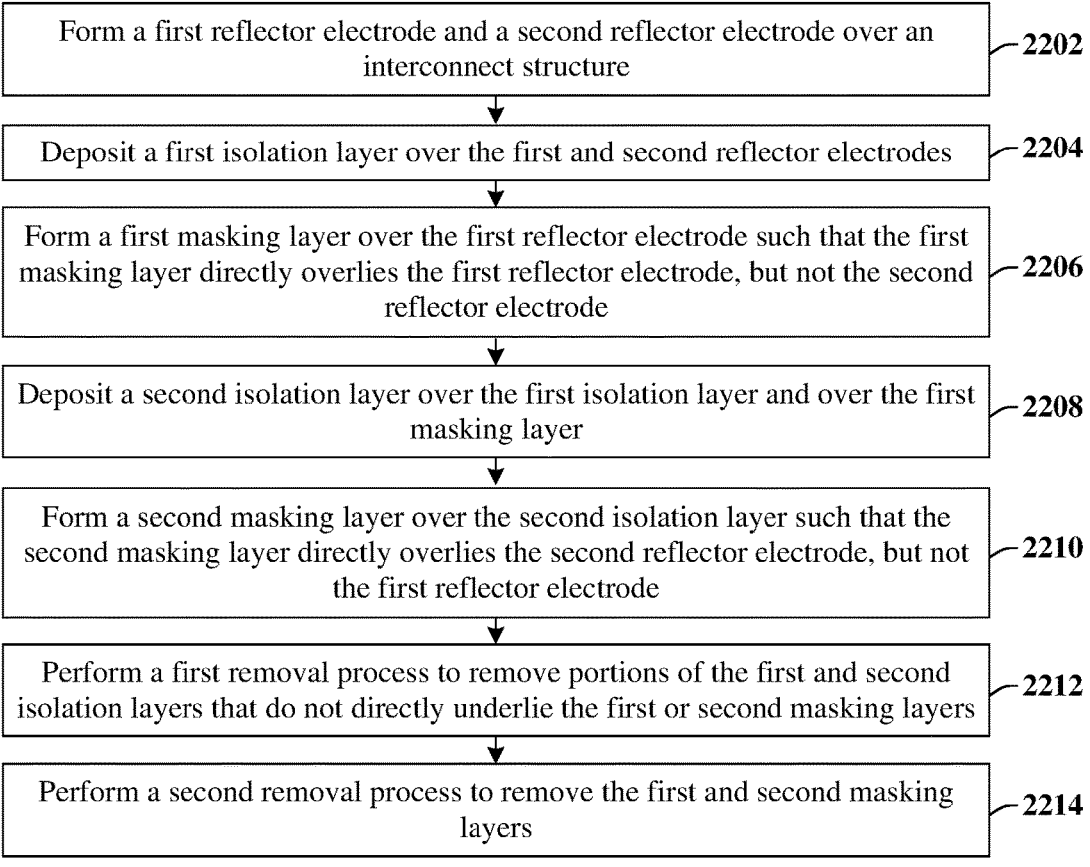

| |
|---|
| Form a first reflector electrode and a second reflector electrode over an interconnect structure — 2202 |

| |
|---|
| Deposit a first isolation layer over the first and second reflector electrodes — 2204 |

| |
|---|
| Form a first masking layer over the first reflector electrode such that the first masking layer directly overlies the first reflector electrode, but not the second reflector electrode — 2206 |

| |
|---|
| Deposit a second isolation layer over the first isolation layer and over the first masking layer — 2208 |

| |
|---|
| Form a second masking layer over the second isolation layer such that the second masking layer directly overlies the second reflector electrode, but not the first reflector electrode — 2210 |

| |
|---|
| Perform a first removal process to remove portions of the first and second isolation layers that do not directly underlie the first or second masking layers — 2212 |

| |
|---|
| Perform a second removal process to remove the first and second masking layers — 2214 |

Fig. 22

METHOD FOR FORMING AN ISOLATION STRUCTURE HAVING MULTIPLE THICKNESSES TO MITIGATE DAMAGE TO A DISPLAY DEVICE

REFERENCE TO RELATED APPLICATION

This Application is a Divisional of U.S. application Ser. No. 16/884,375, filed on May 27, 2020, the contents of which are hereby incorporated by reference in their entirety.

BACKGROUND

Many modern day electronic devices, such as televisions and cellular devices, use image display devices to convert digital data into optical images. To achieve this, the image display device may comprise an array of pixel regions. Each pixel region may have an optical emitter structure and may be coupled to a semiconductor device. The semiconductor device may selectively apply an electrical signal (e.g., a voltage) to the optical emitter structure. Upon application of the electrical signal, the optical emitter structure may emit an optical signal (e.g., light). The optical emitter structure may, for example, be an organic light emitting diode (OLED) or some other suitable light emitting device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 22 illustrates a flow diagram of some embodiments of a method corresponding to FIGS. 5-18, 19A-19C, 20, and 21.

DETAILED DESCRIPTION

Figure 1:
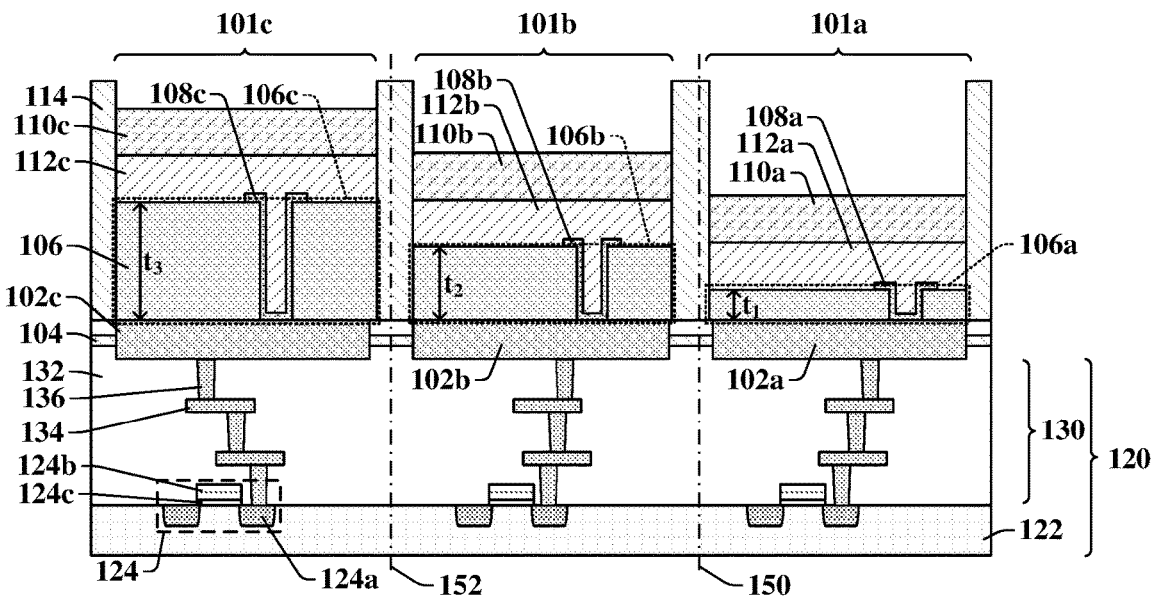
FIG. 1 illustrates a cross-sectional view of some embodiments of a display device having an isolation structure arranged over a reflector electrode structure, where the isolation structure comprises a first portion and further comprises a second portion that is spaced apart from and has a different thickness than the first portion.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A display device includes an array of pixel regions, wherein each pixel region comprises a portion of an isolation structure arranged between a reflector electrode and a transparent electrode. A via structure may extend through the isolation structure to electrically couple the reflector electrode to the transparent electrode. An optical emitter structure may be arranged over the transparent electrode. The isolation structure may comprise silicon dioxide and the portion of the isolation structure may have a thickness that corresponds to a certain color. For example, during operation of the display device, an electrical signal (e.g., voltage) may be applied to the transparent electrode from circuitry coupled to the reflector electrode, the via structure, and the transparent electrode. The electrical signal may cause light to be produced at the interface between the optical emitter structure and the transparent electrode (e.g., due to electron-hole recombination). The light may reflect off a top surface of the isolation structure and/or may travel through the isolation structure, reflect off of the reflector electrode, and travel back towards the top surface of the isolation structure. Due to constructive interference of a given wavelength of light at the top surface of the isolation structure, and/or destructive interface of other wavelengths of light at the top surface of the isolation, colored light according to the thickness of the portion of the isolation structure may be emitted from a top surface of the optical emitter structure.

To form the isolation structure, a first isolation layer may, for example, be formed over a first reflector electrode and a second reflector electrode. The first isolation layer may then be patterned to remove the first isolation layer from the second reflector electrode. A second isolation layer may then be formed over the first isolation layer and the second reflector electrode. However, the patterning of the first isolation layer may damage (e.g., pits, crystal defects, increased surface roughness, etc.) a top surface of the second reflector electrode, and thus, impact the interface between the second isolation layer and the second reflector electrode. For example, an etching process may be used to remove the first isolation layer that covers the second reflector electrode. The etching process may use a dry etchant and damage the top surface of the second reflector electrode by increasing the surface roughness. Because the second reflector electrode receives and reflects light at the top surface of the second reflector, when the top surface is damaged, the reflected light may scatter, which may cause the emitted light to be a different color and/or reduce the intensity of the emitted light, for example. Thus, the aforementioned patterning process may result in an unreliable display device.

Various embodiments of the present disclosure are directed towards a method of forming an isolation structure comprising a first portion, a second portion, and a third portion that are separated from one another to mitigate damage to the underlying reflector electrode structure of a display device. In some embodiments, a first reflector electrode and a second reflector electrode are formed over an interconnect structure. A first isolation layer is deposited over the first and second reflector electrodes. A first masking layer is formed over the first reflector electrode such that the first masking layer directly overlies the first reflector electrode and does not directly overlie the second reflector electrode. A second isolation layer is deposited over the first isolation layer and over the first masking layer. A second masking layer is then formed over the second reflector electrode such that the second masking layer directly overlies the second reflector electrode and does not directly overlie the first reflector electrode or the first masking layer.

A first removal process is performed to remove portions of the first and second isolation layers that do not directly underlie the first or second masking layers. The first and second masking layers are hard masks, and thus, during the first removal process, the first and second masking layers protect the underlying first isolation layer, second isolation layer, first reflector electrode, and second reflector electrode from damage caused by the first removal process. For example, in some embodiments, the first removal process utilizes plasma dry etching, and the first and second masking layers block ions from passing through to underlying first and second isolation layers and underlying first and second reflector electrodes. Further, a second removal process is performed to remove the first and second masking layers. The second removal process may be performed by a wet etch to selectively remove the first and second masking layers, while the first and second reflector electrodes are protected by the first and second isolation layers. Thus, because the first and second reflector electrodes are respectively protected during the first and second removal processes to form the isolation structure, damage to the first and second reflector electrodes is mitigated to produce a reliable device.

FIG. 1 illustrates a cross-sectional view 100 of some embodiments of a display device comprising an isolation structure having first, second, and third portions separated from one another.

The display device of the cross-sectional view 100 includes a first pixel region 101a, a second pixel region 101b, and a third pixel region 101c. Each of the first, second, and third pixel regions 101a, 101b, 101c are configured to emit a different color of light (e.g., red, green, blue) when subjected to an electrical signal (e.g., voltage), and the color of light depends on the thickness and material of an isolation structure 106. For example, in some embodiments, the first pixel region 101a may comprise a first portion 106a of the isolation structure 106 that has a first thickness $t_1$; the second pixel region 101b may comprise a second portion 106b of the isolation structure 106 that has a second thickness $t_2$; and the third pixel region 101c may comprise a third portion 106c of the isolation structure 106 that has a third thickness $t_3$. In some embodiments, the first, second, and third thicknesses $t_1$, $t_2$, $t_3$ are each different from one another. For example, in some embodiments, the first thickness $t_1$ may be less than the second and third thicknesses $t_2$, $t_3$, and the second thickness $t_2$ may be less than the third thickness $t_3$.

In some embodiments, the first portion 106a, the second portion 106b, and the third portion 106c of the isolation structure 106 may each comprise one or more oxides, such as, for example, silicon dioxide, aluminum oxide, or the like. In other embodiments, the first portion 106a, the second portion 106b, and the third portion 106c of the isolation structure 106 may comprise a nitride (e.g., silicon nitride), or some other material that has optical properties, such that colored light is visible from the surface of the material and the colored light is dependent on the thickness of each portion (106a, 106b, 106c) of the isolation structure 106. For example, the first thickness $t_1$ may correspond to red light; the second thickness $t_2$ may correspond to blue light; and the third thickness $t_3$ may correspond to green light.

The first portion 106a of the isolation structure 106 may be arranged between a first reflector electrode 102a and a first transparent electrode 112a. The second portion 106b of the isolation structure 106 may be arranged between a second reflector electrode 102b and a second transparent electrode 112b. The third portion 106c of the isolation structure 106 may be arranged between a third reflector electrode 102c and a third transparent electrode 112c. A first optical emitter structure 110a, a second optical emitter structure 110b, and a third optical emitter structure 110c may be arranged over the first transparent electrode 112a, the second transparent electrode 112b, and the third transparent electrode 112c, respectively. In some embodiments, a first via structure 108a, a second via structure 108b, and a third via structure 108 extend through the first portion 106a of the isolation structure 106, the second portion 106b of the isolation structure 106, and the third portion 106c of the isolation structure 106, respectively. The via structures (108a, 108b, 108c) extend from a top surface to a bottom surface of the portions (106a, 106b, 106c) of the isolation structure 106. Thus, the first via structure 108a may electrically couple the first reflector electrode 102a to the first transparent electrode 112a; the second via structure 108b may electrically couple the second reflector electrode 102b to the second transparent electrode 112b; and the third via structure 108c may electrically couple the third reflector electrode 102c to the third transparent electrode 112c.

In some embodiments, the first, second, and third reflector electrodes 102a, 102b, 102c may be coupled to control circuitry 120. For example, in some embodiments, the first, second, and third reflector electrodes 102a, 102b, 102c are disposed over an interconnect structure 130 comprising a network of interconnect wires 134 and interconnect vias 136 embedded in an interconnect dielectric structure 132. In some embodiments, the interconnect structure 130 is arranged over a substrate 122 and coupled to semiconductor devices 124. In some embodiments, the semiconductor devices 124 may be, for example, metal oxide semiconductor field-effect transistors (MOSFETs) comprising source/drain regions 124a within the substrate 122 and a gate electrode 124b over the substrate 122. The gate electrode 124b may be separated from the substrate 122 by a gate dielectric layer 124c. The control circuitry 120 is configured to selectively supply an electrical signal (e.g., voltage) to each of the first, second, and third pixel regions 101a, 101b, 101c to emit colored light as indicated by digital data. For example, if the electrical signal (e.g., voltage) is supplied to the first reflector electrode 102a from the control circuitry 120, the electrical signal (e.g., voltage) may cause the first optical emitter structure 110a to produce light, and that light may reflect off of top surfaces of the first portion 106a of the isolation structure 106 and/or travel through the first portion 106a of the isolation structure 106, reflect off of the first reflector electrode 102a and exit through the top surfaces of the first portion 106a of the isolation structure 106. Due to constructive and/or destructive interference, colored light dependent on the first thickness $t_1$ and material of the first portion 106a of the isolation structure 106 is visible.

In some embodiments, first barrier structures 104 and/or second barrier structures 114 separate the first, second, and third pixel regions 101a-101c. In some embodiments, each of the first, second, and third portions 106a, 106b, 106c of the isolation structure 106 are completely separated from one another by the second barrier structures 114.

For example, in some embodiments, a first line 150 may be arranged between the first and second portions 106a, 106b of the isolation structure 106 without intersecting the first or second portions 106a, 106b of the isolation structure 106. The first line 150 may continuously extend in a first direction that is normal to an upper surface of the first reflector electrode 102a, and also may be arranged between the first reflector electrode 102a and the second reflector electrode 102b, between the first transparent electrode 112a and the second transparent electrode 112b, and between the first optical emitter structure 110a and the second optical emitter structure 110b. In some embodiments, the first line 150 may intersect the first and second barrier structures 104, 114. Thus, in some embodiments, the second barrier structures 114 directly overlie the first barrier structures 104. Further, a second line 152 that is parallel to the first line 150 and continuously extends in the first direction may be arranged between the second portion 106b of the isolation structure 106 and the third portion 106b of the isolation structure 106 without intersecting the second or third portions 106b, 106c of the isolation structure 106. In some embodiments, each of the first, second, and third portions 106a, 106b, 106c of the isolation structure 106 may be completely separated from one another as a result of protecting the first, second, and third reflector electrodes 102a, 102b, 102c during manufacturing of the isolation structure 106; in some embodiments, the separation amongst the first, second, and third portions 106a, 106b, 106c of the isolation structure 106 also mitigates optical interference between each of the first, second, and third pixel regions 101a, 101b, 101c to provide a reliable display device.

Figure 2:
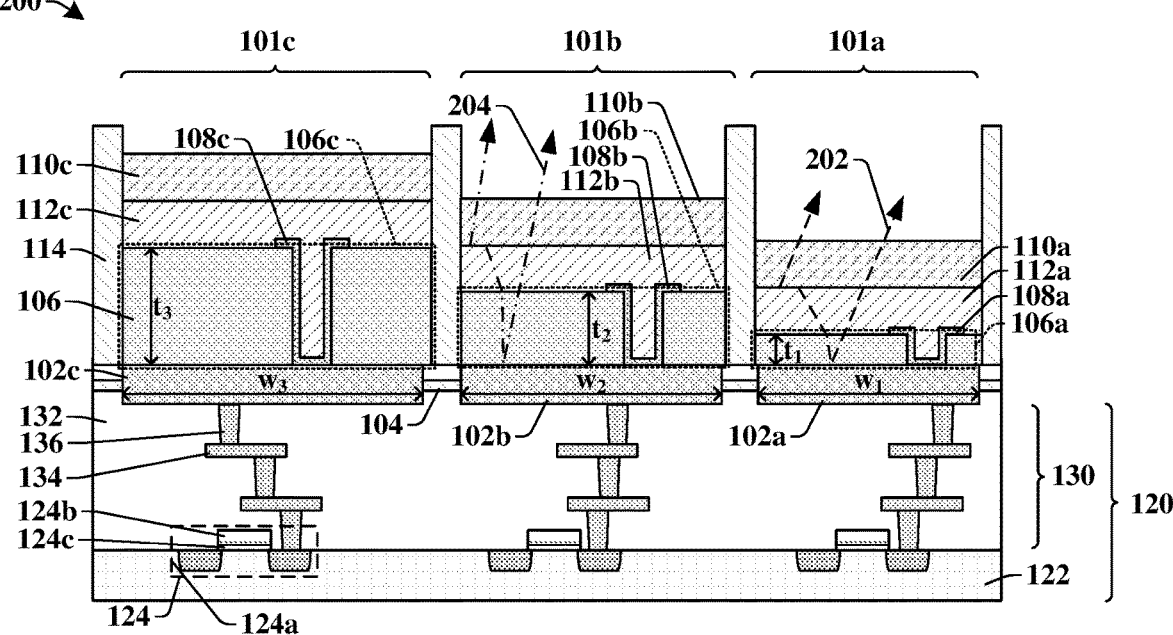
FIG. 2 illustrates a cross-sectional view of some additional embodiments of a display device as in FIG. 1, as well as an example light path through a portion of the isolation structure.

FIG. 2 illustrates a cross-sectional view 200 of some embodiments of a display device comprising an isolation structure having first, second, and third portions separated from one another and an example light path during operation of the display device.

The display device in the cross-sectional view 200 includes a first reflector electrode 102a having a first width $w_1$, a second reflector electrode 102b having a second width $w_2$, and a third reflector electrode 102c having a third width $w_3$. In some embodiments, the first width $w_1$, the second width $w_2$, and the third width $w_3$ may be substantially equal to one another, as in FIG. 1, for example, whereas in other embodiments, as in FIG. 2, the first, second, and third widths $w_1$, $w_2$, $w_3$ may be different from one another. For example, in some embodiments, the third width $w_3$ may be smaller than the second width $w_2$, and the second width $w_2$ may be smaller than the first width $w_1$. In some embodiments, the smallest width (e.g., $w_1$) corresponds to the pixel region (e.g., 101a) that has the portion (e.g., 106a) of the isolation structure 106 with the smallest thickness (e.g., $t_1$). Similarly, in some embodiments, the largest width (e.g., $w_3$) corresponds to the pixel region (e.g., 101a) that has the portion (e.g., 106c) of the isolation structure (e.g., 106) with the largest thickness (e.g., $t_3$). However, in other embodiments, the widths (e.g., $w_1$, $w_2$, $w_3$) of the reflector electrodes (e.g., 102a, 102b, 102c) in each pixel region (e.g., 101a, 101b, 101c) do not have a correlation with the thicknesses (e.g., $t_1$, $t_2$, $t_3$) of the portions (e.g., 106a, 106b, 106c) of the isolation structure (e.g., 106).

The cross-sectional view 200 also illustrates an exemplary first light path 202 in the first pixel region 101a and an exemplary second light path 204 in the second pixel region 101b. In some embodiments, light is generated by the first optical emitter structure 110a and the second optical emitter structure 110b due to an electrical signal (e.g., voltage) applied to the first reflector electrode 102a and the second electrode 102b, respectively, by the control circuitry 120. For example, in the cross-sectional view 200, the first pixel region 101a and the second pixel region 101b are "ON" (e.g., light is generated at the first and second optical emitter structures 110a, 110b), whereas the third pixel region 101c is "OFF" (e.g., light is not generated by the third optical emitter structure 110c). In the first pixel region 101a, the exemplary first light path 202 shows how in some embodiments, the generated light at the first optical emitter structure 110a may reflect off of a top surface of the first portion 106a of the isolation structure 106 and/or travel through the first portion 106a of the isolation structure 106, reflect off of the first reflector electrode 102a, and travel back up towards the top surface of the first portion 106a of the isolation structure 106. Due to constructive interference of a first wavelength and/or destructive interference of remaining wavelengths, colored light having the first wavelength that is emitted/visible from a top surface of the first optical emitter structure 110a in the first pixel region 101a. The first wavelength is associated with the first thickness $t_1$ and material(s) of the first portion 106a of the isolation structure 106 and, in some embodiments, is the only wavelength or the predominant wavelength emitted/visible from the top surface of the first optical emitter structure 110a.

Similarly, in the second pixel region 101b, the exemplary second light path 204 shows how in some embodiments, the generated light at the second optical emitter structure 110b may reflect off of a top surface of the second portion 106b of the isolation structure 106 and/or travel through the second portion 106b of the isolation structure 106, reflect off of the second reflector electrode 102b, and travel back up towards the top surface of the second portion 106b of the isolation structure 106. Due to constructive of a second wavelength and/or destructive interference of remaining wavelengths, colored light having the second wavelength is emitted/visible from a top surface of the second optical emitter structure 110b in the second pixel region 101b. The second wavelength is associated with the second thickness $t_2$ and material(s) of the second portion 106b of the isolation structure 106 and, in some embodiments, is the only wavelength or the predominant wavelength emitted/visible from the top surface of the second optical emitter structure 110b. In some embodiments, because the second thickness $t_2$ of the second portion 106b of the isolation structure 106 is different than the first thickness $t_1$ of the first portion 106a of the isolation structure 106, the second wavelength will be different from the first wavelength, and thus, the second pixel region 101b emits a different colored light than the first pixel region 101a. Thus, the control circuitry 120 may use digital data to selectively turn "ON" one or more of the pixel regions (e.g., 101a, 101b, 101c) to produce an optical image.

Figure 3:
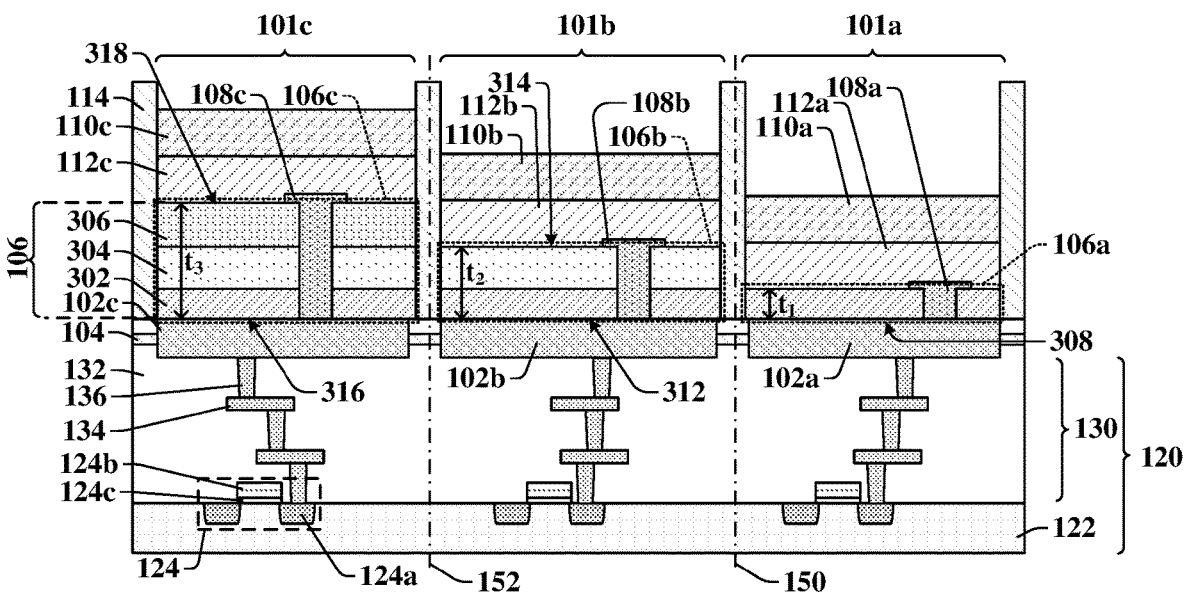
FIGS. 3 and 4 illustrates cross-sectional views of some additional embodiments of a display device as in FIG. 1, wherein the display device comprises an isolation structure having layers of different materials.

FIG. 3 illustrates a cross-sectional view 300 of some embodiments of a display device comprising an isolation structure having first, second, and third portions, wherein the second and third portions comprise multiple layers.

The display device in the cross-sectional view 300 includes: 1) a first portion 106a of an isolation structure 106 comprising a first isolation layer 302; 2) a second portion 106b of the isolation structure 106 comprising a second isolation layer 304 arranged over the first isolation layer 302; and 3) a third portion 106c of the isolation structure 106 comprising the second isolation layer 304 arranged over the first isolation layer 302 and arranged below a third isolation layer 306. The first, second, and third portions 106a, 106b, 106c of the isolation structure 106 are still separated from one another by the second barrier structures 114. In some embodiments, the first, second, and third isolation layers 302, 304, 306 comprise different materials. For example, in some embodiments, the first isolation layer 302 may comprise aluminum oxide; the second isolation layer 302 may comprise silicon dioxide; and the third layer may comprise some other material that has optical properties, such as silicon nitride. In other embodiments, each of the first isolation layer 302, the second isolation layer 304, and the third isolation layer 306 may comprise a same material, such as, for example, silicon dioxide. In such embodiments, the isolation layers (302, 304, 306) may not be distinguishable from one another, and the first, second, and third portions 106a, 106b, 106c of the isolation structure 106 may look like the first, second, and third portions 106a, 106b, 106c of the isolation structure 106 illustrated in the cross-sectional view 100 of FIG. 1.

In some embodiments, the first thickness $t_1$ of the first portion 106a of the isolation structure 106 may equal a thickness of the first isolation layer 302. In some embodiments, the first portion 106a of the isolation structure 106 contacts the first reflector electrode 102a at a first interface 308 and contacts the first transparent electrode 112a at a second interface 310. The first thickness $t_1$ of the first portion 106a of the isolation structure 106 may be measured from the first interface 308 to the second interface 310 in a first direction normal to a top surface of the first reflector electrode 102a. In some embodiments, the second thickness $t_2$ of the second portion 106b of the isolation structure 106 may equal a sum of the thickness of the first isolation layer 302 and a thickness of the second isolation layer 304. In some embodiments, the second portion 106b of the isolation structure 106 contacts the second reflector electrode 102b at a third interface 312 and contacts the second transparent electrode 112b at a fourth interface 314. The second thickness $t_2$ of the second portion 106b of the isolation structure 106 may be measured from the third interface 312 to the fourth interface 314 in the first direction. In some embodiments, the third thickness $t_3$ of the third portion 106c of the isolation structure 106 may equal a sum of the thickness of the first isolation layer 302, the thickness of the second isolation layer 304, and a thickness of a third isolation layer 306. In some embodiments, the third portion 106c of the isolation structure 106 contacts the third reflector electrode 102c at a fifth interface 316 and contacts the third transparent electrode 112c at a sixth interface 318. The third thickness $t_3$ of the third portion 106c of the isolation structure 106 may be measured from the fifth interface 316 to the sixth interface 318 in the first direction.

The cross-sectional view 300 of FIG. 3 further illustrates that in some embodiments, the first, second, and third via structures 108a, 108b, 108c may respectively extend completely through the first, second, and third portions 106a, 160b, 106c of the isolation structure 106. In some embodiments, the via structure (108a,108b,108c) comprises a material that completely fill the space between outer sidewalls of each via structures (108a, 108b, 108c). In other embodiments (e.g., FIG. 1), the transparent electrode (112a, 112b, 112c) fills some of the space between the outer sidewalls of the via structure (108a, 108b, 108c). In such embodiments, the electrical connection between the transparent electrode (112, 112b, 112c) and the reflector electrode (102a, 102b, 102c) may be more efficient because the via structure (108a, 108b, 108c) is thinner between the reflector electrode (102a, 102b, 102c) and the transparent electrode (112a, 112b, 112c).

Figure 4:
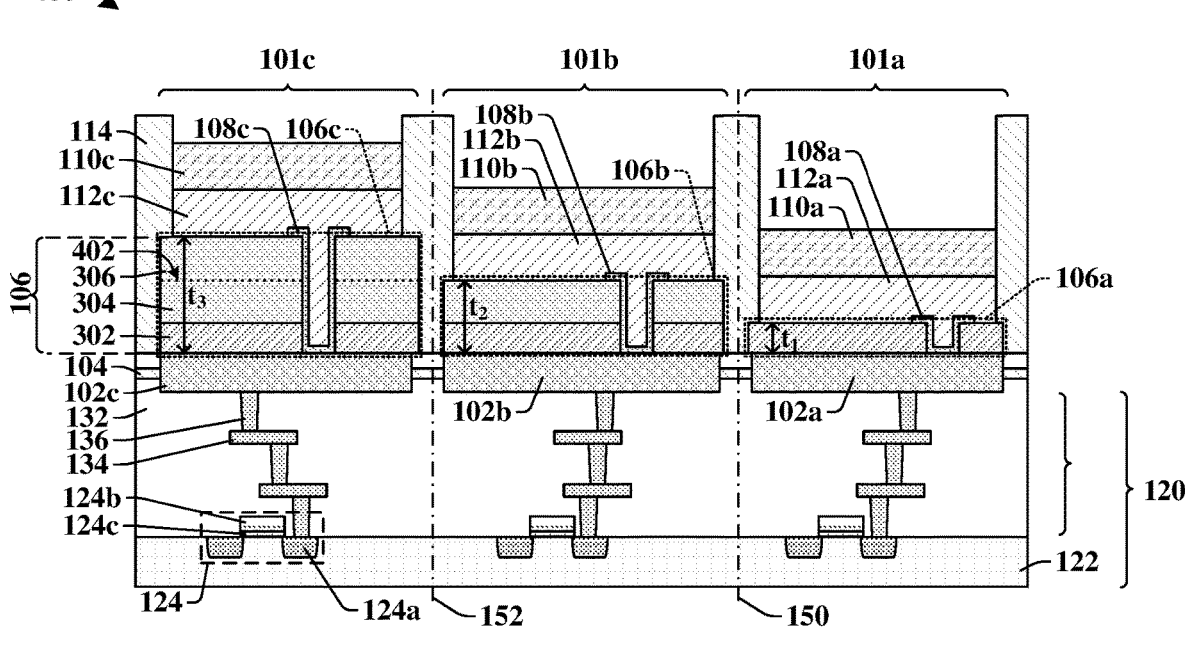

FIG. 4 illustrates a cross-sectional view 400 of an isolation structure having first, second, and third portions, wherein the third portion of the isolation structure comprises second and third layers comprising a same material.

The cross-sectional view 400 of FIG. 4 illustrates some embodiments of a display device wherein the portions (106a, 106b, 106c) of the isolation structure (106) may be wider than their respective overlying transparent electrodes (112a, 112b, 112c) and/or optical emitter structures (110a, 110b, 110c).

Further, the display device in the cross-sectional view 400 includes the first, second, and third portions 106a, 106b, 106c of the isolation structure 106. In some embodiments, the third portion 106c of the isolation structure 106 may comprise the first isolation layer 302, the second isolation layer 304, and the third isolation layer 304. In some embodiments, the first isolation layer 302 may comprise a first material, and the second and third isolation layers 304, 306 may comprise a second material that is different than the first material. For example, in some embodiments, the first material may comprise aluminum oxide, and the second material may comprise silicon dioxide. In some embodiments, the first isolation layer 302 may be thinner than each of second and third isolation layers 304, 306. In such embodiments, the first isolation layer 302 may comprise aluminum oxide, for example, because during deposition, it may be easier to control the thickness of aluminum oxide than silicon dioxide, for example. Because the second and third isolation layers 304, 306 may comprise the same second material, a seventh interface 402 between the second and third isolation layers 304, 306 may not be distinguishable, as illustrated by a dotted line.

FIGS. 5-18, 19A-19C, 20, and 21 illustrate cross-sectional views 500-1800, 1900A-1900C, 2000, and 2100 of some embodiments of a method of forming an isolation structure over a reflector electrode structure to prevent damage to the reflector electrode structure and to produce a reliable display device. Although FIGS. 5-18, 19A-19C, 20, and 21 are described in relation to a method, it will be appreciated that the structures disclosed in FIGS. 5-18, 19A-19C, 20, and 21 are not limited to such a method, but instead may stand alone as structures independent of the method.

Figure 5:
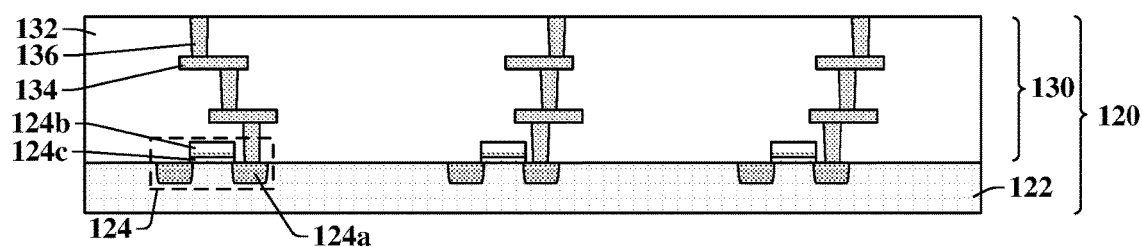
FIGS. 5-18, 19A-19C, 20, and 21 illustrate cross-sectional views of some embodiments of a method of forming a display device having an isolation structure arranged over a reflector electrode structure, wherein the isolation structure comprises first and second portions spaced apart from one another to mitigate damage to the reflector electrode structure.

As shown in the cross-sectional view 500 of FIG. 5, in some embodiments, control circuitry 120 may be formed over a substrate 122. In some embodiments, the control circuitry 120 may comprise an interconnect structure 130 arranged over a substrate 122. The interconnect structure 130 may comprise interconnect wires 134 and interconnect vias 136 embedded in an interconnect dielectric structure 132. In some embodiments, the interconnect wires and vias 134, 136 may comprise copper, tungsten, or the like. The interconnect structure 130 may be coupled to semiconductor devices 124 integrated on the substrate 122. In some embodiments, the semiconductor devices 124 may be or comprise metal oxide semiconductor field-effect transistors (MOSFETs), wherein the MOSFETs comprise source/drain regions 124a in the substrate 122. The semiconductor devices 124 may further comprise a gate electrode 124*b* arranged over a gate dielectric layer 124*c* on the substrate 122.

Figure 6:
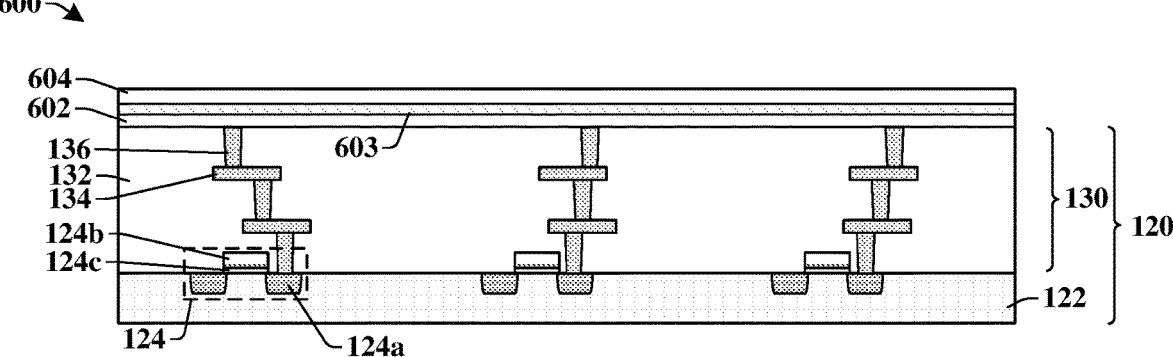

As shown in the cross-sectional view 600 of FIG. 6, a first dielectric layer 602, a first barrier layer 603, and a second dielectric layer 604 may be formed over the interconnect structure 130. In some embodiments, the first dielectric layer 602, the first barrier layer 603, and the second dielectric layer 604 may comprise a same material. In other embodiments, at least the first barrier layer 603 may comprise a different material than the first and/or second dielectric layers 602, 604. The first barrier layer 603 may comprise a dielectric material that may also act as an etch stop layer to protect the interconnect structure 130. For example, in some embodiments, the first barrier layer 603 may comprise a nitride (e.g., silicon nitride), a carbide (e.g., silicon carbide), or the like. Further, in some embodiments, the first and second dielectric layers 604 may comprise a dielectric material such as, for example, nitride (e.g., silicon nitride, silicon oxynitride), a carbide (e.g., silicon carbide), an oxide (e.g., silicon oxide), borosilicate glass (BSG), undoped silicate glass (USG), phosphoric silicate glass (PSG), boro-phosphosilicate glass (BPSG), a low-k oxide (e.g., a carbon doped oxide, SiCOH), or the like. In some embodiments, the first and/or second dielectric layers 604 may comprise a same material as the interconnect dielectric structure 132. In some embodiments, the first dielectric layer 602, the first barrier layer 603, and/or the second dielectric layer 604 may each be formed using a deposition process (e.g., physical vapor deposition (PVD), chemical vapor deposition (CVD), PE-CVD, atomic layer deposition (ALD), sputtering, etc.).

Figure 7:
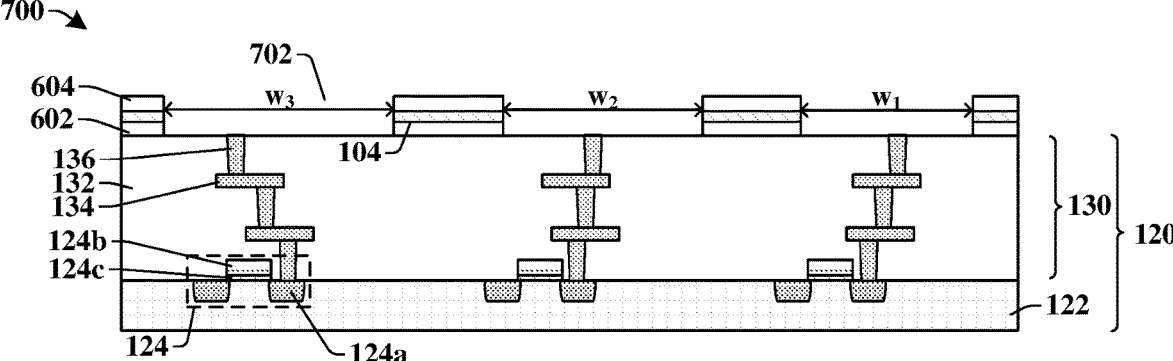

As shown in the cross-sectional view 700 of FIG. 7, portions of the first dielectric layer 602, the second dielectric layer 604, and the first barrier layer (603 of FIG. 6) are removed to define cavities 702 separated by first barrier structures 104. Each cavity 702 may expose a top one of the interconnect vias 136. The cavities 702 may be formed using photolithography and removal (e.g., etching) processes. In some embodiments, each cavity 702 may have equal widths, wherein a first width $w_1$ is equal to a second width $w_2$ and a third width $w_3$. In other embodiments, at least one of the first, second, or third widths $w_1$, $w_2$, $w_3$ is different.

Figure 8:
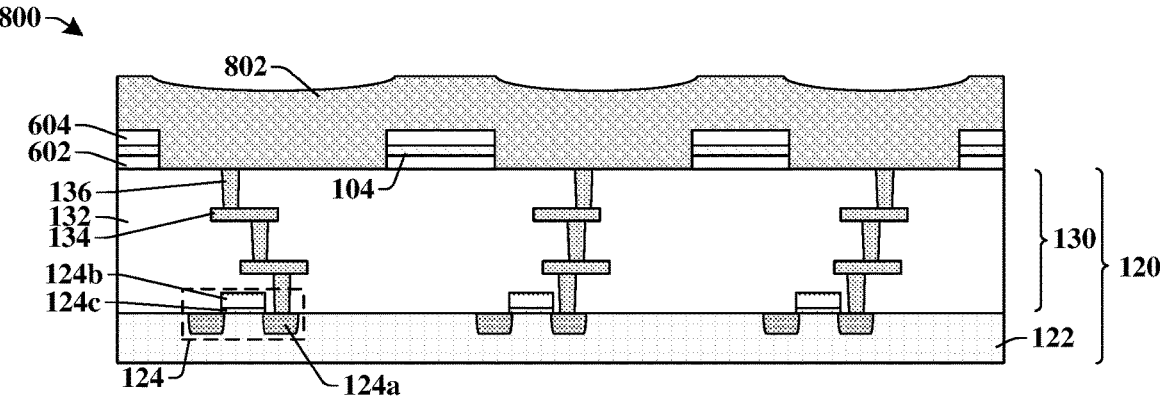

As shown in the cross-sectional view 800 of FIG. 8, a conductive material 802 may be deposited over the interconnect structure 130, such that the conductive material 802 fills in the cavities (702 of FIG. 7). In some embodiments, the conductive material 802 comprises a metal that is both electrically conductive and optically reflective. For example, in some embodiments, the conductive material 802 may comprise aluminum or aluminum copper. The conductive material 802 may be deposited over the interconnect dielectric structure 132 using a deposition process (e.g., physical vapor deposition (PVD), chemical vapor deposition (CVD), PE-CVD, atomic layer deposition (ALD), sputtering, etc.). In some embodiments, the conductive material 802 overfills the cavities (702 of FIG. 7), such that the conductive material 802 has top surfaces above the second dielectric layer 604.

Figure 9:
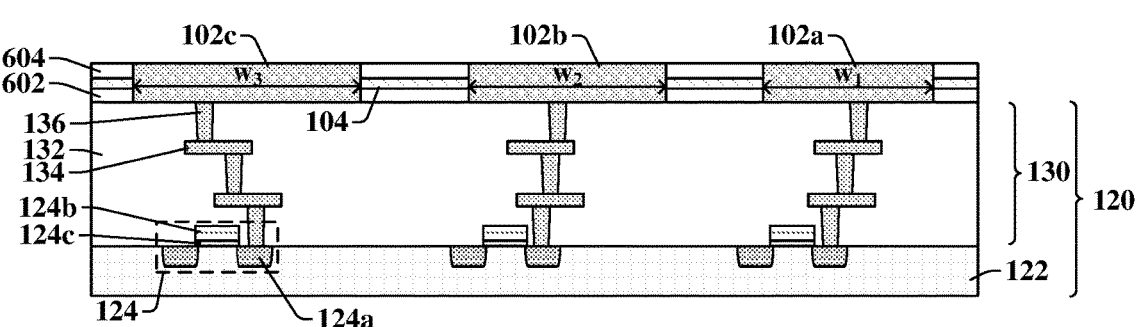

As shown in the cross-sectional view 900 of FIG. 9, a planarization process (e.g., chemical mechanical planarization (CMP)) is performed to remove portions of the conductive material (802 of FIG. 8) that are above the second dielectric layer 604, thereby forming a first reflector electrode 102*a*, a second reflector electrode 102*b*, and a third reflector electrode 102*c*. The first reflector electrode 102*a* may have the first width $w_1$, the second reflector electrode 102*b* may have the second width $w_2$, and the third reflector electrode 102*c* may have the third width $w_3$. The first, second, and third reflector electrodes 102*a*, 102*b*, 102*c* may have upper surfaces that are substantially co-planar with one another. Further, the first, second, and third reflector electrodes 102*a*, 102*b*, 102*c* may have upper surfaces that are substantially co-planar with the second dielectric layer 604. In other embodiments, the planarization process may remove the second dielectric layer 604, for example, and thus, the first, second, and third reflector electrodes 102*a*, 102*b*, 102*c* may have upper surfaces that are substantially co-planar with the first barrier structures 104. The first, second, and third reflector electrodes 102*a*, 102*b*, 102*c* may each be coupled to a different one of the semiconductor devices 124, in some embodiments. Further, each of the first, second, and third reflector electrodes 102*a*, 102*b*, 102*c* may be laterally spaced apart from one another and electrically isolated by one another by the first barrier structures 104.

In some embodiments, after the planarization process, the first reflector electrode 102*a* may have a first average surface roughness, the second reflector electrode 102*b* may have a second average surface roughness, and the third reflector electrode 102*c* may have a third average surface roughness. In some embodiments, the first, second, and third average surface roughness may be substantially equal to one another, as each reflector electrode (102*a*, 102*b*, 102*c*) comprises a same material and is formed simultaneously using a same process method (e.g., deposition of the conductive material 802 of FIG. 8 followed by a planarization process). Because the reflector electrodes (102*a*, 102*b*, 102*c*) have an optical function to reflect light, a low average surface roughness is preferred to mitigate the scattering of light upon reflection. In some embodiments, to measure average surface roughness, a roughness measurement tool (e.g., a profilometer, atomic force microscopy (AFM), etc.) calculates a mean line along a surface and measures the deviation between the height of a peak or valley on the surface from the mean line. After measuring many deviations at many peaks and valleys throughout the surface, the average surface roughness is calculated by taking the mean of the many deviations, where the deviations are absolute values. In other embodiments, the surface roughness is quantified by measuring a total thickness variation (TTV). The TTV of a layer is the difference between the smallest thickness and the largest thickness of the layer. The TTV is measured throughout the length of a layer.

Figure 10:
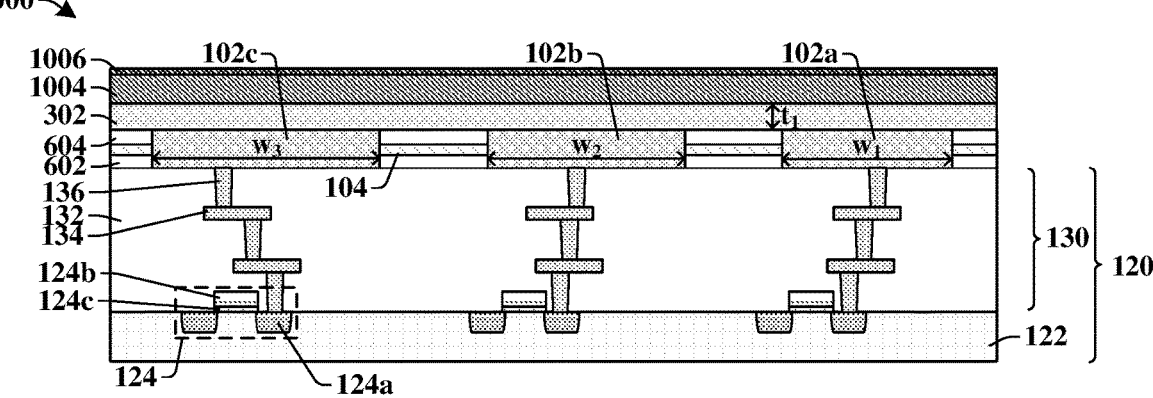

As shown in the cross-sectional view 1000 of FIG. 10, a first isolation layer 302 may be formed over the first, second, and third reflector electrodes 102*a*, 102*b*, 102*c*. In some embodiments, the first isolation layer 302 may comprise a material that has optical properties such that such that colored light is visible from the surface of the material, and wherein the colored light is dependent on the thickness of the first isolation layer 302. In some embodiments, the first isolation layer 302 may comprise, for example, an oxide, such as aluminum oxide or silicon dioxide. The first isolation layer 302 may have a first thickness $t_1$, and in some embodiments, the first thickness $t_1$ may be in a range of between, for example, approximately 200 angstroms and approximately 600 angstroms. In other embodiments, the first thickness $t_1$ may be in a range of between, for example approximately 49 angstroms and approximately 51 angstroms. In such other embodiments, because the first isolation layer 302 may be thin (e.g., less than 100 angstroms), the first isolation layer 302 may comprise aluminum oxide that is deposited by atomic layer deposition (ALD), which allows for precise control of the first thickness $t_1$. In some embodiments, the first isolation layer 302 may be formed using a different deposition process than ALD, such as physical vapor deposition (PVD), chemical vapor deposition (CVD), PE-CVD, sputtering. The first isolation layer 302 may directly contact the first, second, and third reflector electrodes 102a, 102b, 102c.

Further, a first conformal masking layer 1004 may be deposited over the first isolation layer 302. The first conformal masking layer 1004 may comprise, for example, titanium, titanium nitride, tantalum, tantalum nitride, silicon nitride, or the like. Thus, the first conformal masking layer 1004 may be deposited using a deposition process (e.g., physical vapor deposition (PVD), chemical vapor deposition (CVD), PE-CVD, atomic layer deposition (ALD), sputtering, etc.).

Figure 11:
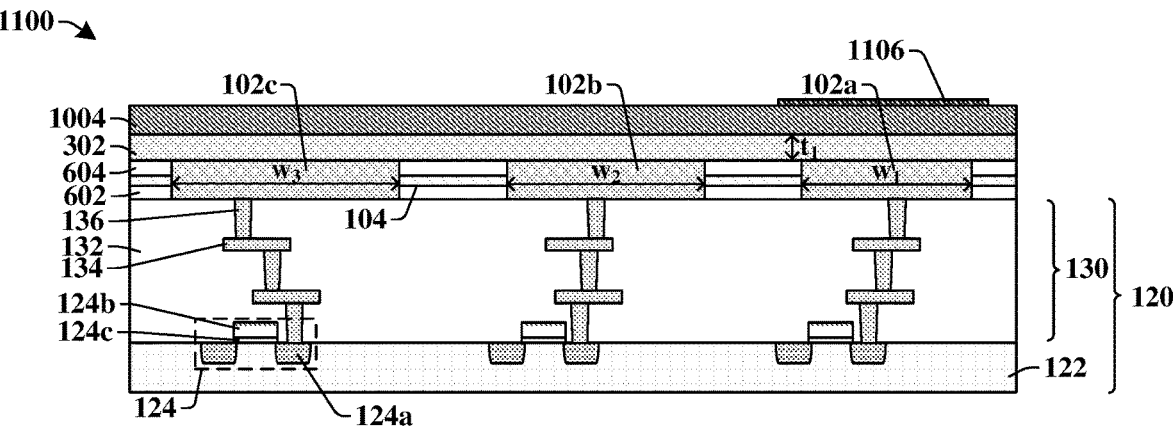
Figure 12:
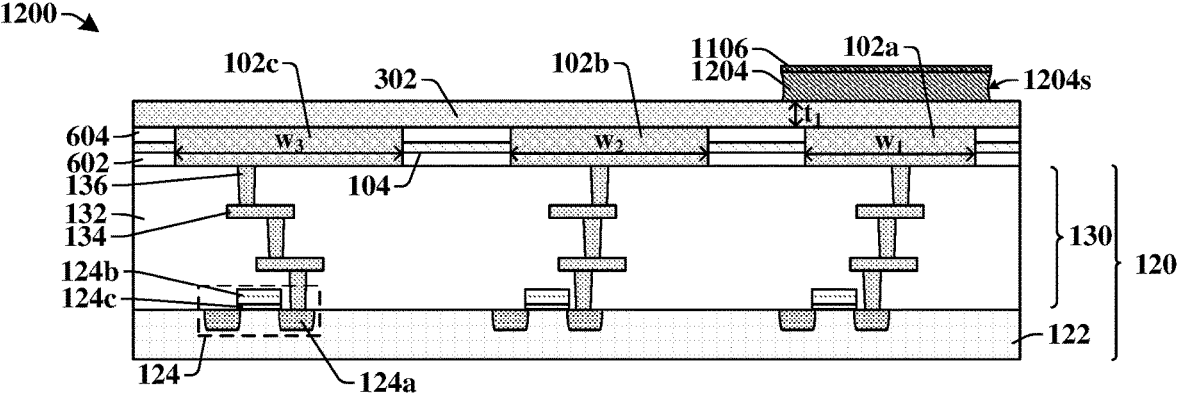

In some embodiments, a first conformal oxide layer 1006 may be formed over the first conformal masking layer 1004. The first conformal oxide layer 1006 may be used to more precisely pattern the first conformal masking layer 1004, as illustrated in FIGS. 11 and 12. However, it will be appreciated that in some embodiments, the first conformal oxide layer 1006 may be omitted. In some embodiments, the first conformal oxide layer 1006 may comprise an oxide material such as, for example, silicon dioxide, silicon oxynitride, aluminum oxide, or the like. The first conformal oxide layer 1006 may, in some embodiments, be formed by using a deposition process (e.g., physical vapor deposition (PVD), chemical vapor deposition (CVD), PE-CVD, atomic layer deposition (ALD), sputtering, etc.).

As shown in the cross-sectional view 1100 of FIG. 11, the first conformal oxide layer (1006 of FIG. 10) may be selectively patterned to form a first oxide layer 1106 over the first conformal masking layer 1004. The first oxide layer 1106 is formed to directly overlie the first reflector electrode 102a, and without directly overlying the second or third reflector electrodes 102b, 102c. Further, in some embodiments, the first oxide layer 1106 completely overlies the first reflector electrode 102a, and thus, the first oxide layer 1106 may have a width that is about equal to or greater than the first width $w_1$ of the first reflector electrode 102a.

In some embodiments, the first oxide layer 1106 may be formed by, for example, a photolithography/etching process or some other suitable process. In some embodiments, a dry etching process may be used to form the first oxide layer 1106, and the first conformal masking layer 1004 may block the passage of ions during the dry etching process, thereby protecting the underlying first isolation layer 302 and first, second, and third reflector electrodes 102a, 102b, 102c from damage due to dry etching.

As shown in the cross-sectional view 1200 of FIG. 12, portions of the first conformal masking layer (1004) that are uncovered by the first oxide layer 1106 may be removed to form a first masking layer 1204. Thus, in some embodiments, the first oxide layer 1106 acts as a mask to form the first masking layer 1204. In some embodiments, a wet etching process is used to remove portions of the first conformal masking layer (1004). The wet etching process may use a wet etchant comprising, for example, hydrogen peroxide. The wet etchant used in the wet etching process does not remove or affect the first isolation layer 302, the second reflector electrode 102b, and the third reflector electrode 102c. Thus, the first isolation layer 302, the second reflector electrode 102b, and the third reflector electrode 102c may remain substantially unchanged during the formation of the first oxide layer 1106 and of the first masking layer 1204. If dry etching were used, ions from the dry etching may pass through the first isolation layer 302 and impinge on the second reflector electrode 102b and the third reflector electrode 102c. This may lead to damage (e.g., composition defects, structural defects, etc.) to the first isolation layer 302, the second reflector electrode 102b, and the third reflector electrode 102c. Such damage may, in turn, lead to light scattering and hence negatively affect the reliability of the display device. In some embodiments, the first masking layer 1204 may have curved outer sidewalls 1204s as a result of the lateral effect of the wet etching process.

Figure 13:
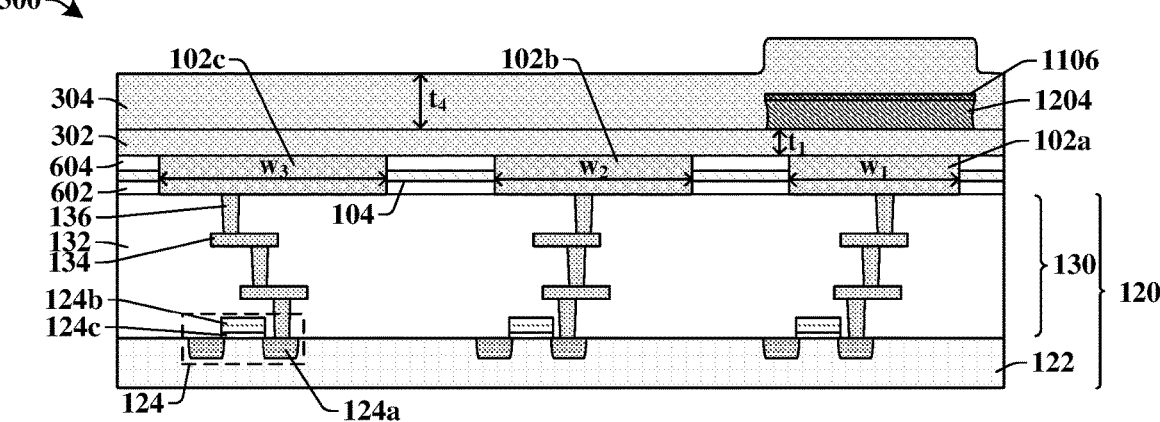

As shown in the cross-sectional view 1300 of FIG. 13, a second isolation layer 304 may be formed over the first isolation layer 302 and the first masking layer 1204. In some embodiments, the second isolation layer 304 may comprise a same or different material than the first isolation layer 302. In some embodiments, the second isolation layer 304 may comprise, for example, an oxide, such as aluminum oxide or silicon dioxide.

The second isolation layer 304 may have a fourth thickness $t_4$, and in some embodiments, the fourth thickness $t_4$ may be in a range of between, for example, approximately 200 angstroms and approximately 800 angstroms. In some other embodiments, the fourth thickness $t_4$ may be in a range of between, for example, approximately 800 angstroms and approximately 1000 angstroms. In some embodiments, the fourth thickness $t_4$ is less than, greater than, or about equal to the first thickness $t_1$ of the first isolation layer 302. For example, in the cross-sectional view 1300, the fourth thickness $t_4$ is greater than the first thickness $t_1$. The second isolation layer 304 may be formed using a deposition process (e.g., physical vapor deposition (PVD), chemical vapor deposition (CVD), PE-CVD, atomic layer deposition (ALD), sputtering, etc.). The second isolation layer 304 may directly contact the first isolation layer 302. In some embodiments, if the first and second isolation layers 302, 304 comprise a same material, an interface between the first and second isolation layers 302, 304 may not be distinguishable.

Figure 14:
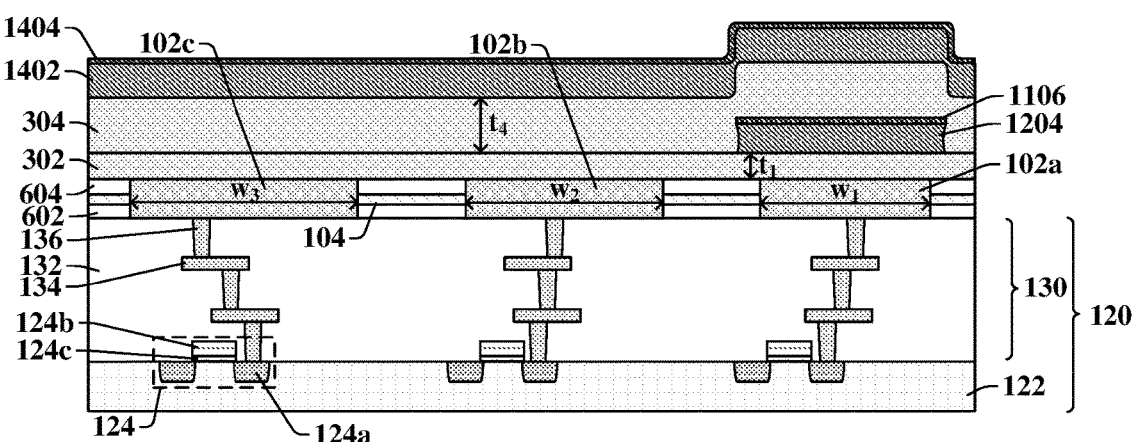

As shown in the cross-sectional view 1400 of FIG. 14, a second conformal masking layer 1402 may be formed over the second isolation layer 304. In some embodiments, the second conformal masking layer 1402 may comprise the same material and may be deposited using the same deposition process as the first conformal masking layer (1004 of FIG. 10). Further, in some embodiments, a second conformal oxide layer 1404 may be deposited over the second conformal masking layer 1402. In some embodiments, the second conformal oxide layer 1404 may comprise the same material and may be deposited using the same deposition process as the first conformal oxide layer (1006 of FIG. 10).

Figure 15:
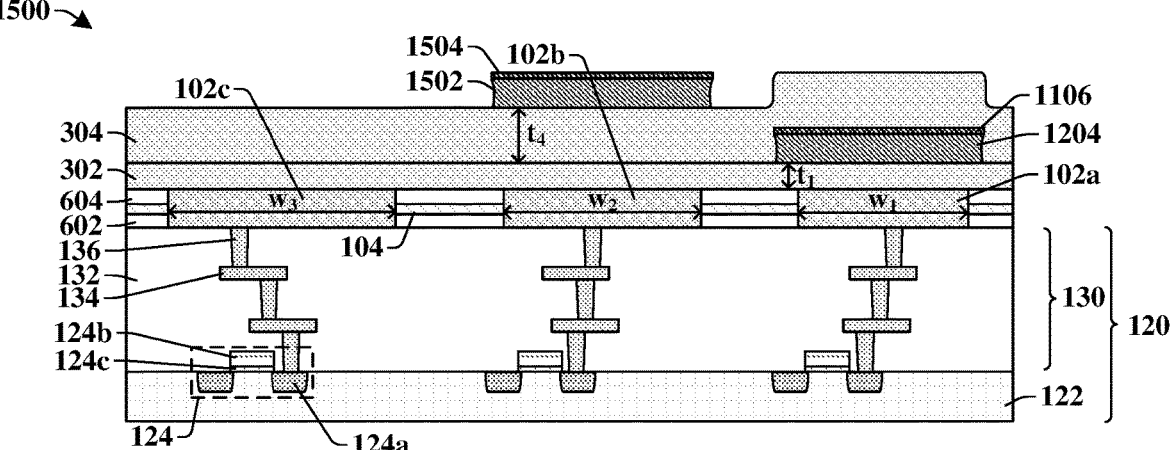

As shown in the cross-sectional view 1500 of FIG. 15, the second conformal oxide layer (1404 of FIG. 14) and the second conformal masking layer (1402 of FIG. 14) may be patterned such that a second masking layer 1502 and a second oxide layer 1504 directly overlie the second reflector electrode 102b without directly overlying the first or third reflector electrodes 102a, 102c. The patterning of the second oxide layer 1504 and the second masking layer 1502 may be conducted using the same or similar steps are presented in FIGS. 11 and 12 regarding the formation of the first oxide layer 1106 arranged over the first masking layer 1204. Further, in some embodiments, the second oxide layer 1504 and the second masking layer 1502 completely overlie the second reflector electrode 102b, and thus, the second oxide layer 1504 and the second masking layer 1502 may each have a width that is about equal to or greater than the second width $w_2$ of the second reflector electrode 102b. Further, similar to the first isolation layer 302 during the formation of the first masking layer 1204, the second isolation layer 304 remains substantially unchanged during the formation of the second masking layer 1502 because the second masking layer 1502 prevents the passage of ions and is patterned using a wet etching process, in some embodiments.

Figure 16:
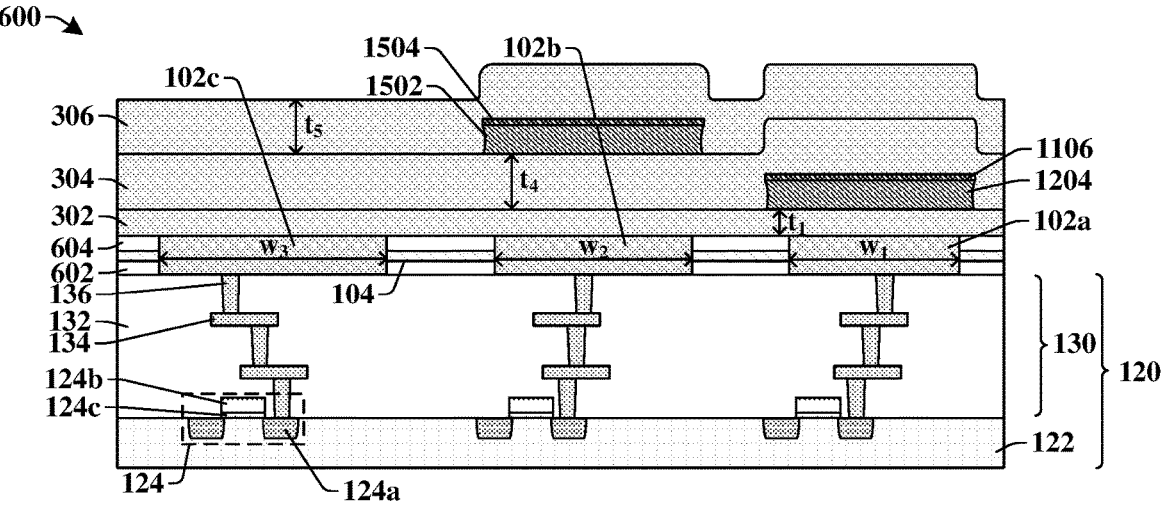

As shown in the cross-sectional view 1600 of FIG. 16, a third isolation layer 306 may be formed over the second isolation layer 304 and the second masking layer 1502. In some embodiments, the third isolation layer 306 may comprise a same or different material than the first isolation layer 302 and/or the second isolation layer 304. In some embodiments, the third isolation layer 306 may comprise, for example, an oxide, such as aluminum oxide or silicon dioxide.

The third isolation layer 306 may have a fifth thickness $t_5$, and in some embodiments, the fifth thickness $t_5$ may be in a range of between, for example, approximately 200 angstroms and approximately 1100 angstroms. In some other embodiments, the fifth thickness $t_5$ may be in a range of between, for example, approximately 1100 angstroms and approximately 1300 angstroms. In some embodiments, the fifth thickness $t_5$ is less than, greater than, or about equal to the fourth thickness $t_4$ of the second isolation layer 304. For example, in the cross-sectional view 1600, the fifth thickness $t_5$ is about equal to the fourth thickness $t_4$. The third isolation layer 306 may be formed using a deposition process (e.g., physical vapor deposition (PVD), chemical vapor deposition (CVD), PE-CVD, atomic layer deposition (ALD), sputtering, etc.). The third isolation layer 306 may directly contact the second isolation layer 304. In some embodiments, if the second and third isolation layers 304, 306 comprise a same material, an interface between the second and third isolation layers 304, 306 may not be distinguishable.

Figure 17:
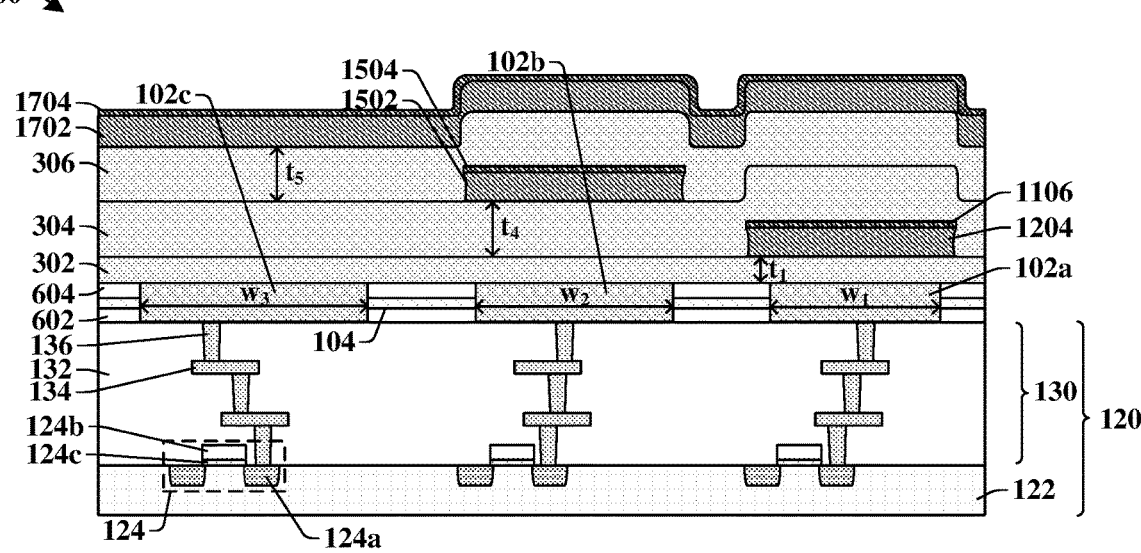

As shown in the cross-sectional view 1700 of FIG. 17, a third conformal masking layer 1702 may be formed over the third isolation layer 306. In some embodiments, the third conformal masking layer 1702 may comprise the same material and may be deposited using the same deposition process as the first conformal masking layer (1004 of FIG. 10). Further, in some embodiments, a third conformal oxide layer 1704 may be deposited over the third conformal masking layer 1702. In some embodiments, the third conformal oxide layer 1704 may comprise the same material and may be deposited using the same deposition process as the first conformal oxide layer (1006 of FIG. 10).

Figure 18:
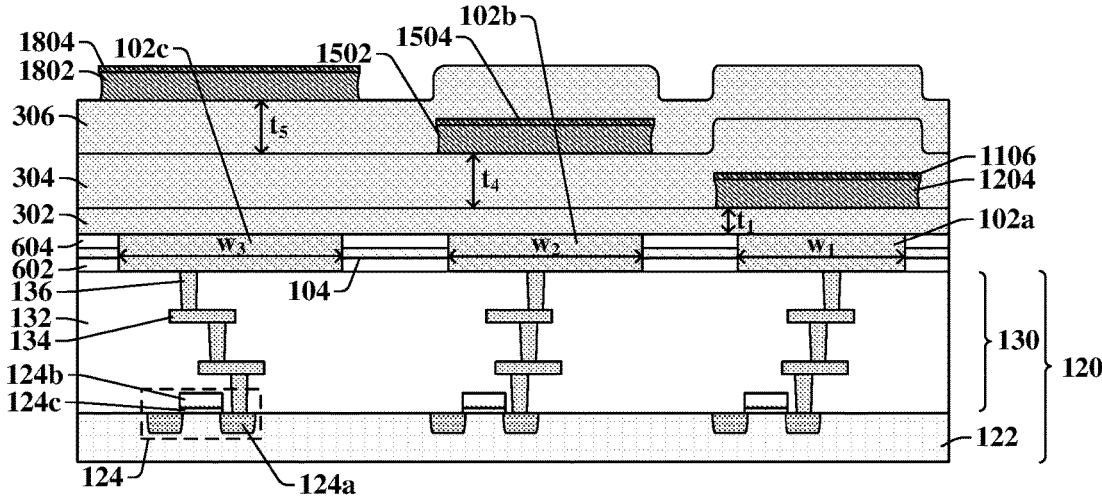

As shown in the cross-sectional view 1800 of FIG. 18, the third conformal oxide layer (1704 of FIG. 17) and the third conformal masking layer (1702 of FIG. 17) may be patterned such that a third masking layer 1802 and a third oxide layer 1804 directly overlie the third reflector electrode 102c without directly overlying the second or third reflector electrodes 102b, 102c. The patterning of the third oxide layer 1804 and the third masking layer 1802 may be conducted using the same or similar steps are presented in FIGS. 11 and 12 regarding the formation of the first oxide layer 1106 arranged over the first masking layer 1204. Further, in some embodiments, the third oxide layer 1804 and the third masking layer 1802 completely overlie the third reflector electrode 102c, and thus, the third oxide layer 1804 and the third masking layer 1802 may each have a width that is about equal to or greater than the third width $w_3$ of the third reflector electrode 102c. Further, similar to the first isolation layer 302 during the formation of the first masking layer 1204, the third isolation layer 306 remains substantially unchanged during the formation of the third masking layer 1802 because the third masking layer 1802 prevents the passage of ions and is patterned using a wet etching process, in some embodiments.

Figure 19A:
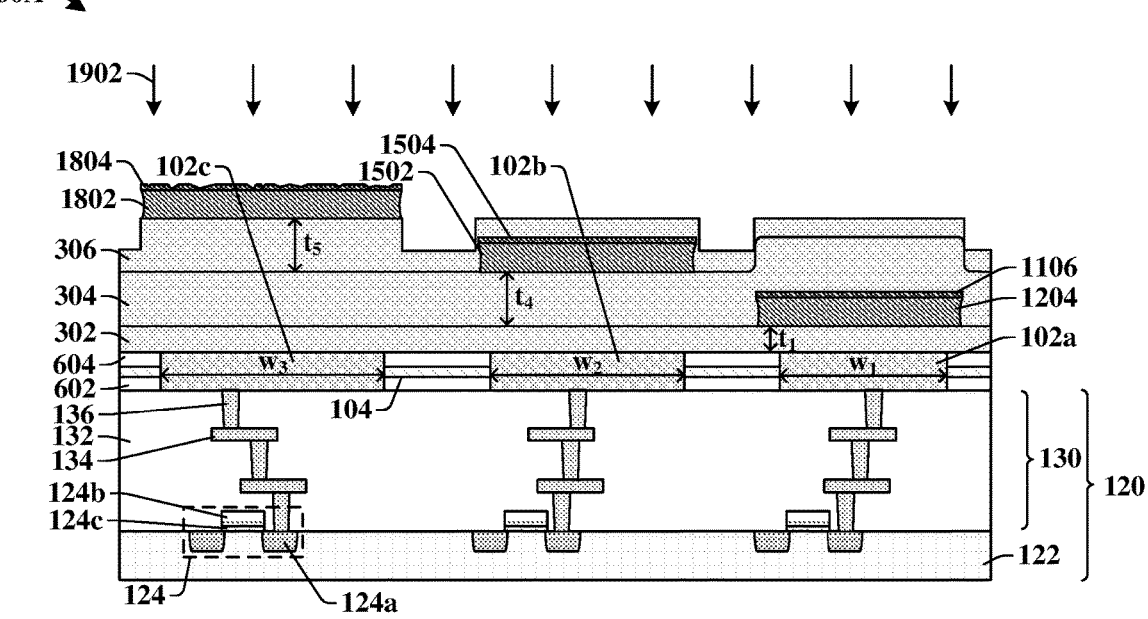
Figure 19B:
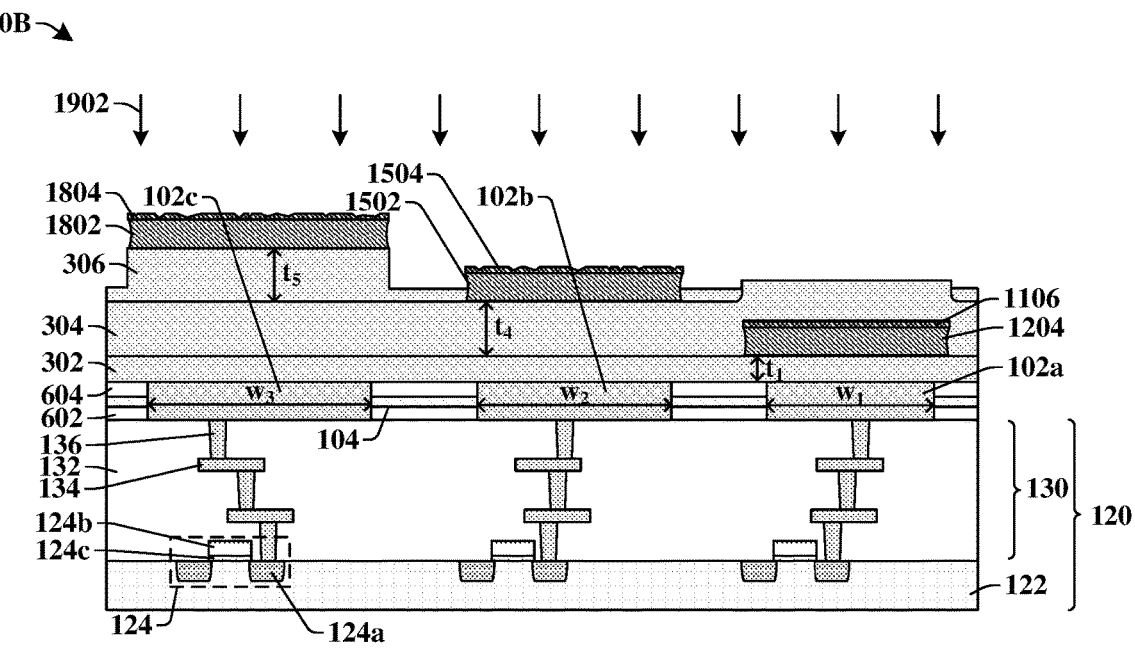
Figure 19C:
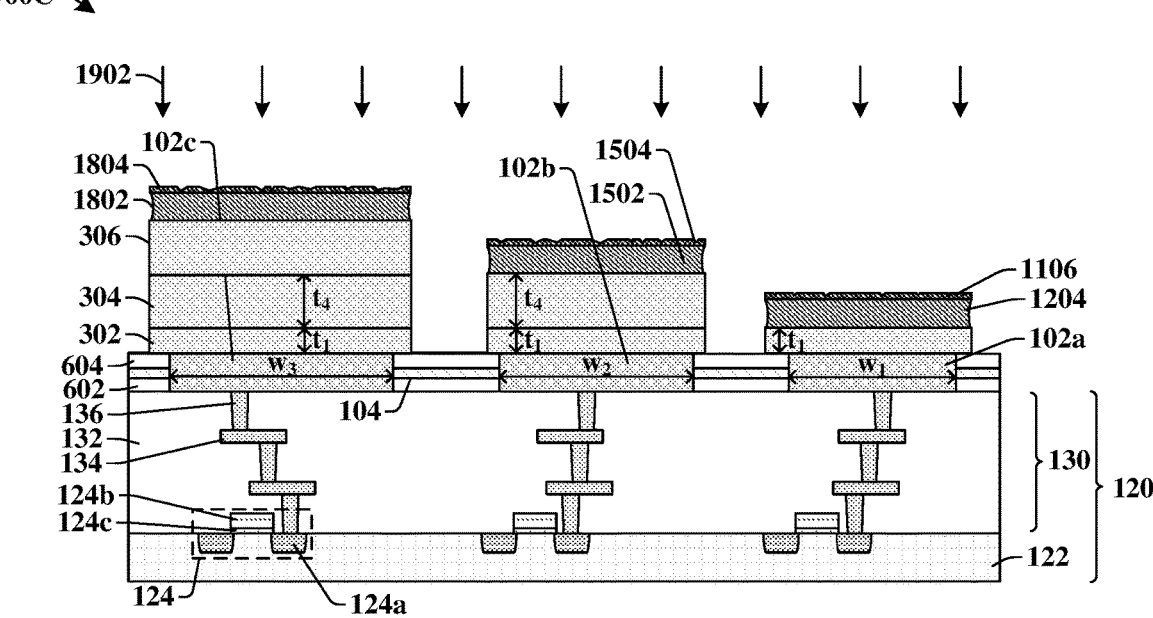

As shown in the cross-sectional views 1900A-1900C of FIGS. 19A-19C, a first removal process 1902 is performed to remove portions of the first, second, and third isolation layers 302, 304, 306 uncovered by the first, second, and third masking layers 1204, 1502, 1802. The cross-sectional views 1900A, 1900B, and 1900C of FIGS. 19A, 19B, and 19C illustrate the first removal process 1902 respectively at a first time, a second time, and a third time, where the second time is after the first time and the third time is after the second time.

During the first time, as illustrated in the cross-sectional view 1900A of FIG. 19A, the third isolation layer 306 that is uncovered by the third masking layer 1802 is removed. In some embodiments, the first removal process 1902 uses a vertical etch. Thus, in some embodiments, the first removal process 1902 is an etching process that utilizes a dry etchant. The dry etchant does not remove the first, second, or third masking layers 1204, 1502, 1802. In some embodiments, the first oxide layer 1106, the second oxide layer 1504, and the third oxide layer 1804 comprise a same material as the first, second, and/or third isolation layers 302, 304, 306. In some embodiments, the first removal process 1902 may partially remove the first, second, and third oxide layers 1106, 1504, 1804 such that after the first removal process 1902, the first, second, and third oxide layers 1106, 1504, 1804 may have a higher average surface roughness than before the first removal process 1902. In other embodiments (not illustrated), the first removal process 1902 may completely remove the first oxide layer 1106, the second oxide layer 1504, and the third oxide layer 1804. Nevertheless, the first, second, and third masking layers 1204, 1502, 1802 cover and protect the underlying first, second, and/or third isolation layers 302, 304, 306 from ions during the dry etch.

During the second time, as illustrated in the cross-sectional view 1900B of FIG. 19B, the first removal process 1902 begins to remove portions of the second isolation layer 304 uncovered by the second and third masking layers 1502, 1802. In some embodiments, the same dry etchant is used during the first removal process 1902. In other embodiments, such as if the first, second, and/or third isolation layers 302, 304, 306 comprise different materials, different dry etchants may be used to effectively remove each of the first, second, and third isolation layers 302, 304, 306 that are uncovered or that do not directly underlie the first, second, or third masking layers 1204, 1502, 1802. For example, in some embodiments, for an oxide-based first, second and/or third isolation layer 302, 304, 306, a carbon fluoride based dry etchant may be used, whereas in some other embodiments, for a nitride-based first, second, and/or third isolation layer 302, 304, 306, a carbon hydrogen fluoride based dry etchant may be used. It will be appreciated that other dry etchants are also within the scope of the disclosure.

During the third time, as illustrated in the cross-sectional view 1900C of FIG. 19C, the first removal process 1902 finishes and removes portions of the first, second, and third isolation layers 302, 304, 306 that do not directly underlie the first, second, or third masking layers 1204, 1502, 1802. The first removal process 1902 may stop at the second dielectric layer 604 or at the first barrier structures 104. Because the first, second, and third masking layers 1204, 1502, 1802 completely overlie the first, second, and third reflector electrodes 102a, 102b, 102c, respectively, the first, second, and third reflector electrodes 102a, 102b, 102c do not get damaged by the first removal process 1902 and therefore maintain the first, second, and third average surface roughnesses, respectively. Thus, patterning of the first, second, and third isolation layers 302, 304, 306 does not damage the first, second, and third reflector electrodes 102a, 102b, 102c and optical properties of the first, second, and third reflector electrodes 102a, 102b, 102c are maintained.

Figure 20:
Figure 20:
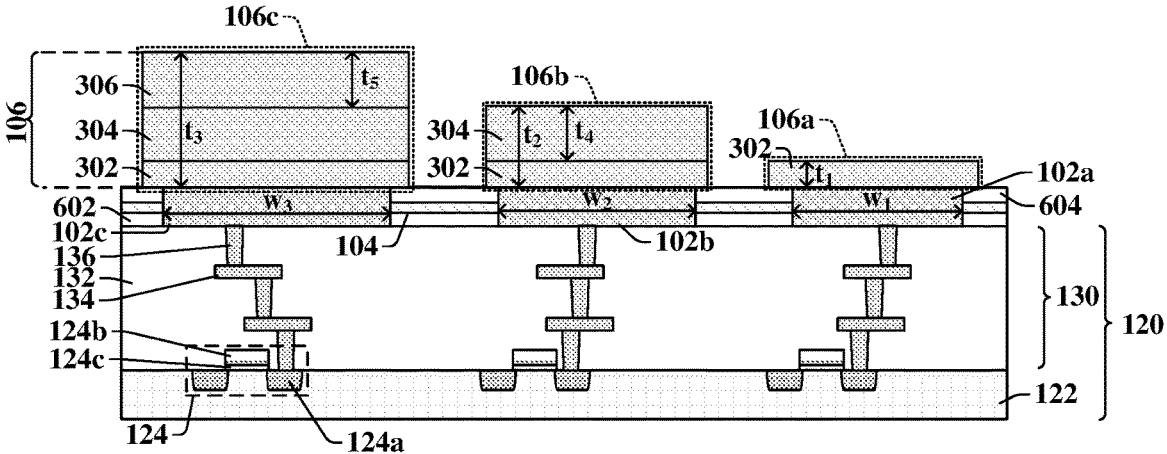

As shown in the cross-sectional view 2000 of FIG. 20, a second removal process may be performed to remove the first, second, and third masking layers (1204, 1502, 1802 of FIG. 19C). Further, in some embodiments, the second removal process also remove the first oxide layer (1106 of FIG. 19C), the second oxide layer (1504 of FIG. 19C), and the third oxide layer (1804 of FIG. 19C). The second removal process, in some embodiments, may comprise, for example, a dry etching process to remove the first oxide layer (1106 of FIG. 19C), the second oxide layer (1504 of FIG. 19C), and the third oxide layer (1804 of FIG. 19C) followed by a wet etching process to remove the first, second, and third masking layers (1204, 1502, 1802 of FIG. 19C). In other embodiments, where the first oxide layer (1106 of FIG. 19C), the second oxide layer (1504 of FIG. 19C), and the third oxide layer (1804 of FIG. 19C) were omitted or where the first oxide layer (1106 of FIG. 19C), the second oxide layer (1504 of FIG. 19C), and the third oxide layer (1804 of FIG. 19C) were removed during the first removal process (1902 of FIGS. 19A, 19B, 19C), for example, the second removal process may only comprise a wet etching process to remove the first, second, and third masking layers (1204, 1502, 1802 of FIG. 19C).

Wet etching is used in place of dry etching to prevent damage to the first, second, and third isolation layers 302-306 and the first, second, and third reflector electrodes 102a-102c. If dry etchants were employed, ions from the dry etching may pass through the first, second, and third isolation layers 302-306 to upper surfaces respectively of the first, second, and third reflector electrodes 102a-102c. This would damage the crystalline structure of the first, second, and third isolation layers 302-306 and would increase upper surface roughness of the first, second, and third reflector electrodes 102a-102c. The crystalline damage and/or increased surface damage would, in turn, increase light scattering and degrade reliability of the display device.

The first, second, and third isolation layers 302, 304, 306 form an isolation structure 106 coupled to the control circuitry 120. A first portion 106a of the isolation structure 106 comprises the first isolation layer 302. The first portion 106a of the isolation structure 106 has the first thickness $t_1$. A second portion 106b of the isolation 106 structure comprises portions respectively of the first isolation layer 302 and the second isolation layer 304 that directly overlie the second reflector electrode 102b. The first isolation layer 302 of the second portion 106b of the isolation structure directly contacts the second reflector electrode 102b. The second portion 106b of the isolation structure 106 has a second thickness $t_2$ that in some embodiments, is in a range of between, for example, approximately 300 angstroms and approximately 1300 angstroms. The second thickness $t_2$ is greater than the first thickness $t_1$, such that an upper surface of the first portion 106a of the isolation structure 106 is below an upper surface of the second portion 106b of the isolation structure 106. The second thickness $t_2$ is equal a sum of the first thickness $t_1$ and the fourth thickness $t_4$. A third portion 106c of the isolation structure 106 directly overlies the third reflector electrode 102c and comprises portions respectively of the first isolation layer 302, the second isolation layer 304, and the third isolation layer 306. The first isolation layer 302 of the third portion 106c of the isolation structure directly contacts the third reflector electrode 102c. The third portion 106c of the isolation structure 106 has a third thickness $t_3$ that, in some embodiments, is in a range of between, for example, approximately 400 angstroms and approximately 1500 angstroms. The third thickness $t_3$ is equal to a sum of the first thickness $t_1$, the second thickness $t_2$, and the third thickness $t_3$. The third thickness $t_3$ may be greater than the second thickness $t_2$, such that the upper surface of the second portion 106b of the isolation structure 106 is below an upper surface of the third portion 106c of the isolation structure 106. The first, second, and third portions 106a, 106b, 106c of the isolation structure 106 are completely laterally spaced apart from one another, allowing for optical isolation.

Figure 21:
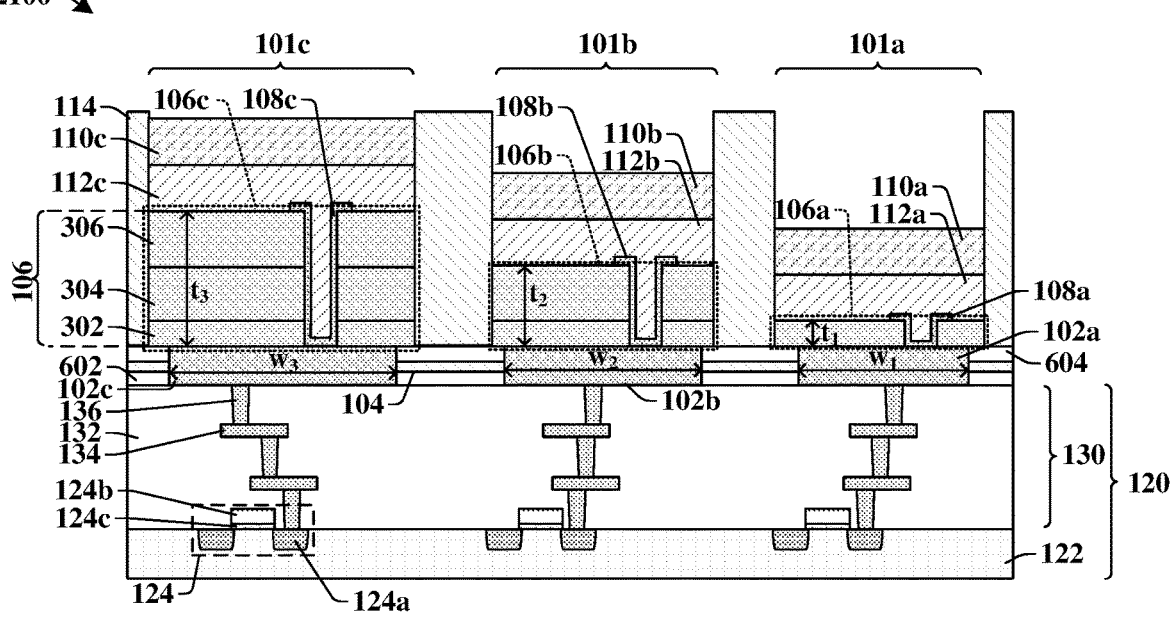

As shown in the cross-sectional view 2100 of FIG. 21, first, second, and third via structures 108a, 108b, 108c are formed over and extending through the first, second, and third portions 106a, 106b, 106c of the interconnect structure, respectively, to contact the first, second, and third reflector electrodes 102a, 102b, 102c, respectively. In some embodiments, the via structures (108a, 108b, 108c) may comprise tantalum, titanium, or some other conductive material.

Further, in some embodiments, first, second, and third transparent electrodes 112a, 112b, 112c may be formed over the first, second, and third portions 106a, 106b, 106c of the isolation structure 106, respectively. The first transparent electrode 112a may directly contact the first portion 106a of the isolation structure 106. The second transparent electrode 112b may directly contact the second portion 106b of the isolation structure 106. The third transparent electrode 112c may directly contact the third portion 106c of the isolation structure 106. In some embodiments, the transparent electrodes (112a, 112b, 112c) comprise an electrically conductive material that is also optically transparent, such as, for example, indium tin oxide (ITO), fluorine tin oxide (FTO), or the like. In some embodiments, each of the transparent electrodes (112a, 112b, 112c) may have a thickness that is, for example, in a range of between approximately 500 angstroms and approximately 3000 angstroms.

In some embodiments, a first optical emitter structure 110a, a second optical emitter structure 110b, and a third optical emitter structure 110c may be respectively formed over the first transparent electrode 112a, the second transparent electrode 112b, and the third transparent electrode 112c. In some embodiments, the optical emitter structures (110a, 110b, 110c) may be or comprise an organic light emitting diode (OLED) or some other suitable light generating device. In some embodiments, each of the optical emitter structures (110a, 110b, 110c) may have a thickness in the range of between, for example, approximately 500 angstroms and approximately 3000 angstroms.

In some embodiments, second barrier structures 114 are formed to separate the transparent electrodes (112a, 112b, 112c) and the optical emitter structures (110a, 110b, 110c) to define a first pixel region 101a, a second pixel region 101b, and a third pixel region 101c. Further, the second barrier structures 114 may completely separate the first, second, and third portions 106a, 106b, 106c of the isolation structure 106. It will be appreciated that the display device may comprise an array of pixel regions, and may comprise more than the first, second, and third pixel regions 101a, 101b, 101c. Some of the second barrier structures 114 may directly overlie the first barrier structures 104, and the second barrier structures 114 may comprise a dielectric material to electrically and optically isolate the pixel regions (101a, 101b, 101c) from one another. For example, the second barrier structures 114 may comprise a nitride (e.g., silicon nitride, silicon oxynitride), an oxide (e.g., silicon oxide), or the like. For example, in some other embodiments, the second barrier structures 114 may comprise a multi-layer film stack of silicon nitride and silicon oxide. Further, in some embodiments, the second barrier structures 114 may comprise a same material as the isolation structure 106, the first barrier structures 104, and/or the interconnect dielectric structure 132. In other embodiments, the second barrier structures 114 may comprise a different material as the isolation structure 106, the first barrier structures 104, and/or the interconnect dielectric structure 132.

It will be appreciated that the via structures (108a, 108b, 108c), the transparent electrodes (112a, 112b, 112c), the optical emitter structures (110a, 110b, 110c), and the second barrier structures 114 may each be formed through various steps comprising deposition processes (e.g., physical vapor deposition (PVD), chemical vapor deposition (CVD), PE-CVD, atomic layer deposition (ALD), sputtering, etc.), removal processes (e.g., wet etching, dry etching, chemical mechanical planarization (CMP), etc.), and/or patterning processes (e.g., photolithography/etching).

Thus, the display device comprises control circuitry 120 to selectively operate the first, second, and third pixel regions 101a, 101b, 101c. Because the first, second, and third reflector electrodes 102a, 102b, 102c are protected from the first removal process (1902 of FIGS. 19A, 19B, 19C) by the first, second, and third masking layers 1204, 1502, 1802, respectively, each of the pixel regions (101a, 101b, 101c) may be selectively operated by the control circuitry 120 to reliably emit colored light depending on the thicknesses ($t_1$, $t_2$, $t_3$) and/or materials of each portion (106a, 106b, 106c) of the isolation structure (106).

FIG. 22 illustrates a flow diagram of some embodiments of a method 2200 corresponding to FIGS. 5-18, 19A-19C, 20, and 21.

While method 2200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2202, a first reflector electrode and a second reflector electrode are formed over an interconnect structure. FIGS. 7-9 illustrate cross-sectional views 700-900 of some embodiments corresponding to act 2202.

At act 2204, a first isolation layer is deposited over the first and second reflector electrodes. FIG. 10 illustrates cross-sectional view 1000 of some embodiments corresponding to act 2204.

At act 2206, a first masking layer is formed over the first reflector electrode such that the first masking layer directly overlies the first reflector electrode but not the second reflector electrode. FIGS. 10-12 illustrate cross-sectional views 1000-1200 of some embodiments corresponding to act 2206.

At act 2208, a second isolation layer is deposited over the first isolation layer and over the first masking layer. FIG. 13 illustrates cross-sectional view 1300 of some embodiments corresponding to act 2208.

At act 2210, a second masking layer is formed over the second isolation layer such that the second masking layer directly overlies the second reflector electrode but not the first reflector electrode. FIGS. 14 and 15 illustrate cross-sectional views 1400 and 1500, respectively, of some embodiments corresponding to act 1910.

At act 2212, a first removal process is performed to remove portions of the first and second isolation layers that do not directly underlie the first or second masking layers. FIGS. 19A, 19B, and 19C illustrate cross-sectional views 1900A, 1900B, and 1900C, respectively, of some embodiments corresponding to act 2212.

At act 2214, a second removal process is performed to remove the first and second masking layers. FIG. 20 illustrates cross-sectional view 2000 of some embodiments corresponding to act 2214.

Therefore, the present disclosure relates to a method of forming an isolation structure that prevents damage to upper surfaces of an underlying reflector electrode structure to improve reliability of a display device.

Accordingly, in some embodiments, the present disclosure relates to a display device comprising: a first reflector electrode; a second reflector electrode that is separated from the first reflector electrode; an isolation structure overlying the first and second reflector electrodes, the isolation structure comprising: a first portion that overlies the first reflector electrode and has a first thickness, and a second portion that overlies the second reflector electrode, has a second thickness greater than the first thickness, and is separated from the first portion of the isolation structure; and a first optical emitter structure and a second optical emitter structure respectively overlying the first and second portions of the isolation structure.

In other embodiments, the present disclosure relates to a display device comprising: a first reflector electrode and a second reflector electrode over an interconnect structure; a first isolation layer comprising a pair of segments that are spaced from each other and that respectively overlie the first and second reflector electrodes; a second isolation layer overlying the first isolation layer and the second reflector electrode, but not the first reflector electrode; a first optical emitter structure overlying the first isolation layer and the first reflector electrode and a second optical emitter structure overlying the second isolation layer and the second reflector electrode; and a first conductive structure and a second conductive structure respectively extending from the first reflector electrode to the first optical emitter structure and from the second reflector electrode to the second optical emitter structure, wherein the first conductive structure extends through the first isolation layer, and wherein the second conductive structure extends through the first and second isolation layers.

In yet other embodiments, the present disclosure relates to a method of forming a display device, comprising: forming a first reflector electrode and a second reflector electrode over an interconnect structure, wherein the first reflector electrode is laterally separated from the second reflector electrode; depositing a first isolation layer over the first and second reflector electrodes; forming a first masking layer directly overlying the first reflector electrode; depositing a second isolation layer over the first isolation layer and over the first masking layer; forming a second masking layer over the second isolation layer and directly overlying the second reflector electrode; performing a first removal process to remove portions of the first and second isolation layers that do not directly underlie the first or second masking layers; and performing a second removal process to remove the first and second masking layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a display device, comprising:

forming a first reflector electrode and a second reflector electrode over an interconnect structure, wherein the first reflector electrode is laterally separated from the second reflector electrode;

depositing a first isolation layer over the first and second reflector electrodes;

forming a first masking layer directly overlying the first reflector electrode, but not the second reflector electrode;

depositing a second isolation layer over the first isolation layer and over the first masking layer;

forming a second masking layer over the second isolation layer and directly overlying the second reflector electrode, but not the first reflector electrode;

forming a third isolation layer extending continuously from over an upper surface of the second masking layer, downward along an outer sidewall of the second masking layer, laterally to an outer sidewall of the second isolation layer, and upward over an upper surface of the second isolation layer;

performing a first removal process to remove portions of the third isolation layer and to remove portions of the first and second isolation layers uncovered by the first and second masking layers, wherein the first removal process segments the first isolation layer into a plurality of segments that are spaced from each other and that include a first segment and a second segment respectively overlying the first and second reflector electrodes;

performing a second removal process to remove the first and second masking layers;

forming a first conductive structure directly over the first reflector electrode and extending through the first isolation layer to directly contact the first reflector electrode;

forming a second conductive structure directly over the second reflector electrode and extending through the first and second isolation layers to directly contact the second reflector electrode;

forming a first transparent electrode over and in direct contact with the first conductive structure;

forming a second transparent electrode over and in direct contact with the second conductive structure;

forming a first optical emitter structure over the first transparent electrode; and forming a second optical emitter structure over the second transparent electrode;

wherein the first reflector electrode has outer sidewalls that are spaced apart by a first width, the first segment of the first isolation layer has outer sidewalls that are spaced apart by a second width, the second reflector electrode has outer sidewalls that are spaced apart by a third width, and the second segment of the first isolation layer has outer sidewalls that are spaced apart by a fourth width, and wherein the second width is greater than the first width, the fourth width is greater than the third width, and the third width is greater than the first width.

2. The method of claim 1, wherein the first removal process comprises dry etching, and wherein the second removal process comprises wet etching.

3. The method of claim 1, further comprising:

forming a third masking layer on the third isolation layer prior to the first removal process, wherein the first removal process is then carried out to remove the portions of the third isolation layer and the portions of the first and second isolation layers while the third masking layer is in place.

4. The method of claim 1, wherein the forming of the first masking layer comprises:

depositing a first conformal masking layer over the first isolation layer;

depositing a first conformal oxide layer over the first conformal masking layer;

patterning the first conformal oxide layer using a dry etchant to form a first oxide layer that directly overlies the first reflector electrode; and patterning the first conformal masking layer using a wet etchant according to the first oxide layer to form the first masking layer.

5. The method of claim 4, wherein after the first removal process, the first oxide layer has a higher average surface roughness than before the first removal process.

6. The method of claim 1, wherein the first transparent electrode and the first optical emitter structure are stacked overlying the first segment of the first isolation layer and share the second width.

7. A method of forming a display device, comprising:

forming a first reflector electrode and a second reflector electrode over an interconnect structure, wherein the first reflector electrode is laterally separated from the second reflector electrode and overlies and is inset into a dielectric film with a top surface level with a top surface of the dielectric film;

depositing a first isolation layer over the first and second reflector electrodes;

forming a first masking layer over the first reflector electrode and over the second reflector electrode;

patterning the first masking layer to establish a patterned first masking layer that directly overlies the first isolation layer and the first reflector electrode but that does not directly overlie the second reflector electrode;

depositing a second isolation layer over the patterned first masking layer and over the second reflector electrode;

forming a second masking layer over the second isolation layer;

patterning the second masking layer to establish a patterned second masking layer that directly overlies the second reflector electrode but that does not directly overlie the first reflector electrode;

forming a third isolation layer extending continuously from over an upper surface of the patterned second masking layer downward along an outer sidewall of the patterned second masking layer laterally to an outer sidewall of the second isolation layer and upward over an upper surface of the second isolation layer;

performing a first removal process to remove portions of the first and second isolation layers that are not covered by the patterned first or second masking layers;

after the first removal process, performing a second removal process to remove the patterned first and second masking layers;

forming a first conductive structure directly over the first reflector electrode and extending through the first isolation layer to directly contact the first reflector electrode;

forming a second conductive structure directly over the second reflector electrode and extending through the first and second isolation layers to directly contact the second reflector electrode;

forming a first transparent electrode over a remaining portion of the first isolation layer and in direct contact with the first conductive structure;

forming a second transparent electrode over a remaining portion of the second isolation layer and in direct contact with the second conductive structure;

forming a first optical emitter structure over the first transparent electrode; and forming a second optical emitter structure over the second transparent electrode;

wherein the first removal process forms a trench between and adjoining a first segment of the first isolation layer that overlies the first reflector electrode and a second segment of the first isolation layer that overlies the second reflector electrode, wherein the trench extends to the dielectric film, while remaining spaced from the first and second reflector electrodes, at completion of the first removal process, wherein the first reflector electrode has outer sidewalls that are spaced apart by a first width, wherein the first segment of the first isolation layer, the first transparent electrode, and the first optical emitter structure each have outer sidewalls that are spaced apart by a second width, and wherein the first width is less than the second width.

8. The method of claim 7, wherein the first removal process forms a plurality of trenches, including the trench, that extend downwards to segment the first and second isolation layers.

9. The method of claim 8, further comprising:

forming dielectric barrier structures in the plurality of trenches, the dielectric barrier structures having individual heights that extend from an upper surface of the first and second reflector electrodes to over individual upper surfaces of the first and second transparent electrodes.

10. The method of claim 7, wherein the forming of the patterned first masking layer comprises:

depositing the first masking layer conformally over the first isolation layer;

depositing a first oxide layer conformally over the first masking layer;

patterning the first oxide layer using a dry etchant to form a patterned first oxide layer that directly overlies the first reflector electrode; and patterning the first masking layer using a wet etchant according to the patterned first oxide layer to form the patterned first masking layer.

11. The method of claim 10, wherein after the first removal process, the patterned first oxide layer has a higher average surface roughness than before the first removal process.

12. The method according to claim 7, wherein the dielectric film comprises a first dielectric layer, a barrier layer overlying the first dielectric layer, and a dielectric layer overlying the barrier layer, wherein the trench extends to the barrier layer, which separates the trench from the first dielectric layer, and wherein the first and second reflector electrodes have individual bottom surfaces level with a bottom surface of the first dielectric layer.

13. The method according to claim 7, further comprising:

forming a first oxide layer stacked over the first masking layer; and patterning the first oxide layer to form a patterned first oxide layer overlying the first reflector electrode but not the second reflector electrode, wherein the first masking layer is patterned with the patterned first oxide layer in place and the second isolation layer is deposited over the patterned first oxide layer, wherein the patterned first masking layer is between and contacts the patterned first oxide layer and the first segment of the first isolation layer at completion of the first removal process, and wherein the patterned first masking layer has opposite sidewalls that are curved and that are separated by a separation less than a width of the patterned first oxide layer and a width of the first segment of the first isolation layer at completion of the first removal process.

14. The method of claim 13, wherein after the first removal process, the patterned first oxide layer has a higher average surface roughness than before the first removal process.

15. A method of forming a display device, comprising:

forming a first reflector electrode, a second reflector electrode, and a third reflector electrode over an interconnect structure on a semiconductor substrate, wherein the second reflector electrode is between and borders the first and third reflector electrodes;

depositing a first isolation layer over the first and second reflector electrodes, the first isolation layer comprising a first dielectric material;

forming a first masking layer over the first reflector electrode and over the second reflector electrode;

patterning the first masking layer to form a patterned first masking layer overlying the first isolation layer and the first reflector electrode but not overlying the second reflector electrode;

depositing a second isolation layer over the patterned first masking layer and the second reflector electrode, wherein the second isolation layer comprises a second dielectric material that differs from the first dielectric material;

forming a second masking layer over the second isolation layer;

patterning the second masking layer to form a patterned second masking layer overlying the second reflector electrode but not overlying the first reflector electrode;

forming a third isolation layer extending continuously from over an upper surface of the patterned second masking layer, downward along an outer sidewall of the patterned second masking layer, laterally to an outer sidewall of the second isolation layer, and upward over an upper surface of the second isolation layer;

performing a first removal process to remove portions of the first and second isolation layers that are not covered by the patterned first or second masking layers;

after the first removal process, performing a second removal process to remove the patterned first and second masking layers;

forming a first conductive structure, a second conductive structure, and a third conductive structure directly over and contacting the first reflector electrode, the second reflector electrode, and the third reflector electrode, respectively;

after the second removal process, forming a first transparent electrode, a second transparent electrode, and a third transparent electrode respectively overlying the first reflector electrode, the second reflector electrode, and the third reflector electrode and respectively atop a remaining portion of the first isolation layer, a remaining portion of the second isolation layer, and a remaining portion of the third isolation layer;

forming a first optical emitter structure over the first transparent electrode;

forming a second optical emitter structure over the second transparent electrode; and forming a first barrier structure and a second barrier structure separating the second transparent electrode respectively from the first and third transparent electrodes and sharing a common height;

wherein the first reflector electrode has outer sidewalls spaced apart by a first width, wherein a portion of the first isolation layer overlying the first reflector electrode, the first transparent electrode, and the first optical emitter structure each have outer sidewalls spaced apart by a second width greater than the first width, wherein a width of the first barrier structure is less than a separation between the first and second reflector electrodes, and wherein a width of the second barrier structure is less than a separation between the second and third reflectors electrodes and is greater than a width of the first barrier structure.

16. The method of claim 15, wherein the performing of the second removal process leaves other portions of the first and second isolation layers that were covered by the patterned first or second masking layers in place.

17. The method of claim 15, wherein the first optical emitter structure is disposed at a first height over an upper surface of the semiconductor substrate and the second optical emitter structure is disposed at a second height over the upper surface of the semiconductor substrate, the second height being greater than the first height.

18. The method of claim 15, wherein the first removal process forms trenches that extend downwards to define a first segment of the first isolation layer that is over the first reflector electrode and a second segment of the first isolation layer that is over the second reflector electrode.

19. The method of claim 15, wherein the first and second barrier structures share a height that extends from an elevation at individual upper surfaces of the first and second reflector electrodes to an elevation over individual upper surfaces of the first and second transparent electrodes.

20. The method of claim 15, wherein the first isolation layer comprises aluminum oxide or silicon dioxide, and the second isolation layer comprises aluminum oxide or silicon dioxide and is a different material than the first isolation layer.

* * * * *